US011956998B2

(12) United States Patent
Son et al.

(10) Patent No.: US 11,956,998 B2
(45) Date of Patent: Apr. 9, 2024

(54) DISPLAY DEVICE INCLUDING MULTI-LAYERED BUFFER LAYER

(71) Applicant: SAMSUNG DISPLAY CO., LTD., Yongin-si (KR)

(72) Inventors: Se Wan Son, Yongin-si (KR); Moo Soon Ko, Seoul (KR); Rae Young Gwak, Seoul (KR); Jin Seock Ma, Hwaseong-si (KR); Min Jeong Park, Gumi-si (KR); Ki Bok Yoo, Anyang-si (KR); So La Lee, Hwaseong-si (KR); Jin Goo Jung, Seongnam-si (KR); Jong Won Chae, Asan-si (KR); Ye Ji Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/150,193

(22) Filed: Jan. 4, 2023

(65) Prior Publication Data
US 2023/0157076 A1 May 18, 2023

Related U.S. Application Data

(63) Continuation of application No. 17/116,922, filed on Dec. 9, 2020, now Pat. No. 11,552,150.

(30) Foreign Application Priority Data

Apr. 22, 2020 (KR) .......................... 10-2020-0048808

(51) Int. Cl.
H10K 59/121 (2023.01)
H10K 50/844 (2023.01)
H10K 59/35 (2023.01)

(52) U.S. Cl.
CPC ....... *H10K 59/1213* (2023.02); *H10K 50/844* (2023.02); *H10K 59/353* (2023.02)

(58) Field of Classification Search
CPC .............. H10K 50/844; H10K 59/121; H10K 59/1213; H10K 59/353; H10K 59/40;
(Continued)

(56) References Cited

U.S. PATENT DOCUMENTS 9,257,563 B2    2/2016   Ahn et al.
11,056,551 B2   7/2021   Park et al.
(Continued)

FOREIGN PATENT DOCUMENTS

EP     3200234 A1    8/2017
JP     5467660 B2    4/2014
(Continued)

OTHER PUBLICATIONS

EPO Extended European Search Report dated Sep. 16, 2021, issued in corresponding European Patent Application No. 21169562.2 (9 pages).

*Primary Examiner* — Matthew E. Gordon
(74) *Attorney, Agent, or Firm* — Lewis Roca Rothgerber Christie LLP

(57) ABSTRACT

A display device includes: a first substrate including a pixel area and a transmissive area; a thin-film transistor on the first substrate; a planarization layer on the thin-film transistor; a first light emitting electrode on the planarization layer; a bank covering a part of the first light emitting electrode; a light emitting layer on the first light emitting electrode; and a second light emitting electrode on the light emitting layer and the bank. The transmissive area includes a transmissive hole penetrating the bank and the planarization layer.

19 Claims, 19 Drawing Sheets

(58) Field of Classification Search
CPC .............. H10K 59/873; H01L 27/3276; H01L 29/7869; H01L 51/56
USPC .......................................................... 257/40
See application file for complete search history.

(56) References Cited

U.S. PATENT DOCUMENTS

| | | |
|---|---|---|
| 2011/0220901 A1 | 9/2011 | Ha et al. |
| 2016/0126494 A1 | 5/2016 | Jung et al. |
| 2016/0233289 A1 | 8/2016 | Son et al. |
| 2017/0133444 A1 | 5/2017 | Lee et al. |
| 2017/0221976 A1 | 8/2017 | Park et al. |
| 2018/0145118 A1* | 5/2018 | Kim ................... H10K 59/121 |
| 2019/0181205 A1* | 6/2019 | Kim ................... H10K 59/124 |
| 2020/0119304 A1 | 4/2020 | Choi et al. |
| 2021/0193754 A1 | 6/2021 | Han et al. |
| 2021/0202868 A1* | 7/2021 | Paek ..................... H10K 59/12 |
| 2021/0408190 A1* | 12/2021 | Yang ................... H10K 77/111 |

FOREIGN PATENT DOCUMENTS

| | | |
|---|---|---|
| KR | 10-2016-0071567 A | 6/2016 |
| KR | 10-2018-0033361 A | 4/2018 |
| KR | 10-2019-0073716 A | 6/2019 |
| KR | 10-2019-0091711 A | 8/2019 |

\* cited by examiner

DISPLAY DEVICE INCLUDING MULTI-LAYERED BUFFER LAYER

CROSS-REFERENCE TO RELATED APPLICATIONS

This application is a continuation of U.S. patent application Ser. No. 17/116,922, filed Dec. 9, 2020, which claims priority to and the benefit of Korean Patent Application No. 10-2020-0048808, filed Apr. 22, 2020, the entire content of both of which is incorporated herein by reference.

BACKGROUND

1. Field

Aspects of example embodiments of the present disclosure relate to a display device.

2. Description of the Related Art

As information society develops, the demand for display devices for displaying images is increasing in various forms. For example, display devices are being applied to various electronic devices such as smartphones, digital cameras, notebook computers, navigation devices, smart televisions, and the like. A display device may include a display panel that includes a plurality of pixels connected to scan lines, data lines, and power lines to display an image. In addition, the display device may include various optical devices such as an image sensor for capturing an image of a front surface of the display device, a proximity sensor for sensing whether a user is located within a proximity (e.g., close to or adjacent to) the front surface of the display device, an illuminance sensor for sensing illuminance of the front surface of the display device, and an iris sensor for recognizing a user's iris. The optical devices may be disposed in a hole in the front surface of the display device that does not overlap with the display panel.

As display devices are applied to various electronic devices, display devices with various designs are being desired. For example, in the case of a smartphone, there is a demand for a display device that can widen a display area by removing a hole that does not overlap with a display panel from a front surface of the display device. In this case, optical devices disposed in a hole in the front surface of the display device may overlap with a display panel. However, when the optical devices overlap with the display panel, the optical devices may be covered by pixels, scan lines, data lines, and/or power lines of the display panel. Therefore, the amount of light incident on the optical devices may be reduced, resulting in deterioration of functions of the optical devices.

The above information disclosed in this Background section is for enhancement of understanding of the background of the present disclosure, and therefore, it may contain information that does not constitute prior art.

SUMMARY

One or more example embodiments of the present disclosure are directed toward a display device that may prevent or substantially prevent a reduction in the amount of light incident on an optical device even when the optical device overlaps with a display panel.

However, aspects and features of the present disclosure are not limited to those set forth herein. The above and other example embodiments of the present disclosure will become more apparent to one of ordinary skill in the art to which the present disclosure pertains by referencing the figures and the detailed description of the present disclosure.

According to one or more example embodiments of the present disclosure, a display device includes: a first substrate including a pixel area and a transmissive area; a thin-film transistor on the first substrate; a planarization layer on the thin-film transistor; a first light emitting electrode on the planarization layer; a bank covering a part of the first light emitting electrode; a light emitting layer on the first light emitting electrode; and a second light emitting electrode on the light emitting layer and the bank. The transmissive area includes a transmissive hole penetrating the bank and the planarization layer.

In an example embodiment, the display device may further include an encapsulation layer including a first inorganic layer on the second light emitting electrode, an organic layer on the first inorganic layer, and a second inorganic layer on the organic layer, and the organic layer may fill the transmissive hole.

In an example embodiment, the display device may further include an interlayer insulating film on a gate electrode of the thin-film transistor, and the first inorganic layer may contact the interlayer insulating film at the transmissive area.

In an example embodiment, the transmissive hole may further penetrate the interlayer insulating film.

In an example embodiment, the display device may further include a gate insulating layer on an active layer of the thin-film transistor. The gate electrode of the thin-film transistor may be on the gate insulating layer, and the first inorganic layer may contact the gate insulating layer at the transmissive area.

In an example embodiment, the display device may further include: a first buffer layer on the first substrate; a second substrate on the first buffer layer; and a second buffer layer on the second substrate, and the active layer of the thin-film transistor may be on the second buffer layer.

In an example embodiment, the transmissive hole may further penetrate the interlayer insulating film and the gate insulating layer.

In an example embodiment, the first inorganic layer may contact the second buffer layer at the transmissive area.

In an example embodiment, the transmissive hole may further penetrate the interlayer insulating film, the gate insulating layer, and the second buffer layer.

In an example embodiment, the first inorganic layer may contact the second substrate at the transmissive area.

In an example embodiment, the transmissive hole may further penetrate the interlayer insulating film, the gate insulating layer, the second buffer layer, and the second substrate.

In an example embodiment, the first inorganic layer may contact the first buffer layer at the transmissive area.

In an example embodiment, the second buffer layer may protrude further in a direction in which the first substrate extends than the second substrate at the transmissive area.

In an example embodiment, the first inorganic layer may contact a lower surface of the second buffer layer.

According to one or more example embodiments of the present disclosure, a display device includes: a pixel area including a plurality of subpixels for displaying an image; and a transmissive area adjacent to the pixel area. The pixel area includes a first substrate, a thin-film transistor on the first substrate, a light emitting element on the thin-film transistor and configured to emit light, and an encapsulation layer on the light emitting element. The transmissive area includes the first substrate and the encapsulation layer, and the encapsulation layer includes a first inorganic layer, an organic layer on the first inorganic layer, and a second inorganic layer on the organic layer. A maximum thickness of the organic layer at the pixel area is smaller than a maximum thickness of the organic layer at the transmissive area.

In an example embodiment, the pixel area may further include a gate insulating layer on an active layer of the thin-film transistor, and an interlayer insulating film on a gate electrode of the thin-film transistor, and the transmissive area may further include at least one of the gate insulating layer and the interlayer insulating film.

In an example embodiment, the first inorganic layer may contact at least any one of the gate insulating layer and the interlayer insulating film at the transmissive area.

In an example embodiment, the pixel area may further include: a first buffer layer on the first substrate; a second substrate on the first buffer layer; and a second buffer layer between the second substrate and the active layer of the thin-film transistor.

In an example embodiment, the transmissive area may further include the first buffer layer, the second substrate, and the second buffer layer, and the first inorganic layer may contact the second buffer layer at the transmissive area.

In an example embodiment, the transmissive area may further include the first buffer layer and the second substrate, and the first inorganic layer may contact the second substrate at the transmissive area.

In an example embodiment, the transmissive area may further include the first buffer layer, and the first inorganic layer may contact the first buffer layer at the transmissive area.

In an example embodiment, the second buffer layer may protrude further in a direction in which the first substrate extends than the second substrate at the transmissive area.

In an example embodiment, the first inorganic layer may contact a lower surface of the second buffer layer.

According to one or more example embodiments of the present disclosure, a display device includes: a display panel including a pixel area including a plurality of subpixels for displaying an image, and a transmissive area surrounded by the pixel area; and an optical device overlapping with the transmissive area of the display panel in a thickness direction of the display panel. The display panel includes: a first substrate; a thin-film transistor on the first substrate; a planarization layer on the thin-film transistor; a first light emitting electrode on the planarization layer; a bank covering a part of the first light emitting electrode; a light emitting layer on the first light emitting electrode; and a second light emitting electrode on the light emitting layer and the bank. The transmissive area includes a transmissive hole penetrating the bank and the planarization layer.

According to one or more of the aforementioned example embodiments and other example embodiments of the present disclosure, optical devices may be disposed in a sub-display area of a display panel including transmissive areas. Therefore, even when the optical devices overlap with the display panel, a reduction in the amount of light incident on the optical devices may be reduced.

Other aspects, features, and example embodiments of the present disclosure may be apparent from the following detailed description, the drawings, and the claims and equivalents thereof.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
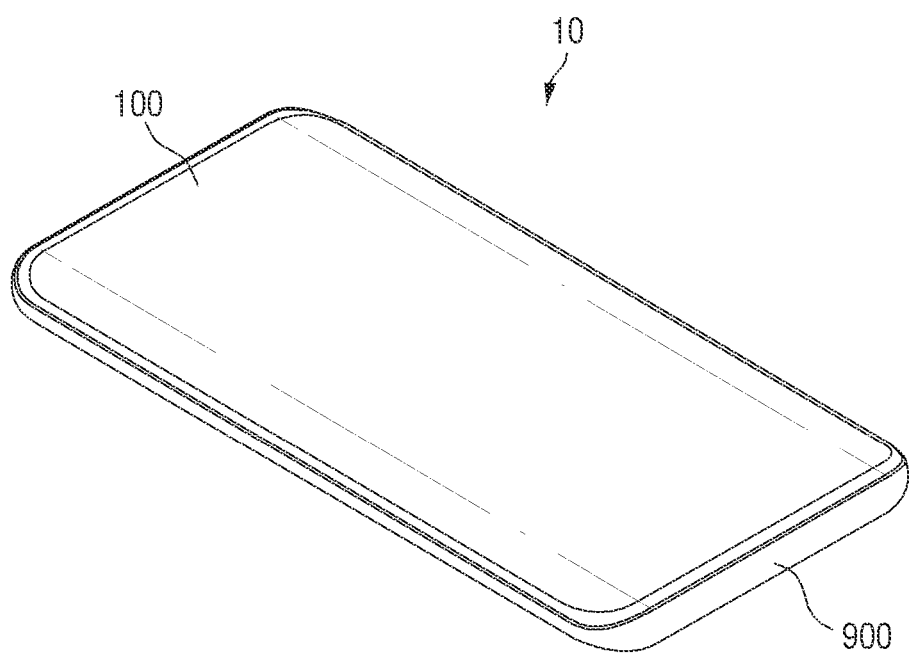
FIG. 1 is a perspective view of a display device according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," "bottom," "top," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," "coupled to," or "adjacent to" another element or layer, it can be directly on, connected to, coupled to, or adjacent to the other element or layer, or one or more intervening elements or layers may be present. In contrast, when an element or layer is referred to as being "directly on," "directly connected to," "directly coupled to," or "immediately adjacent to" another element or layer, there are no intervening elements or layers present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a," "an," and "the" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," "one of," and "selected from" when preceding a list of elements, modify the entire list of elements and do not modify the individual elements of the list. Phrases such as "a plan view" may refer to a view from a top or from a direction normal to a display area of a display device.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
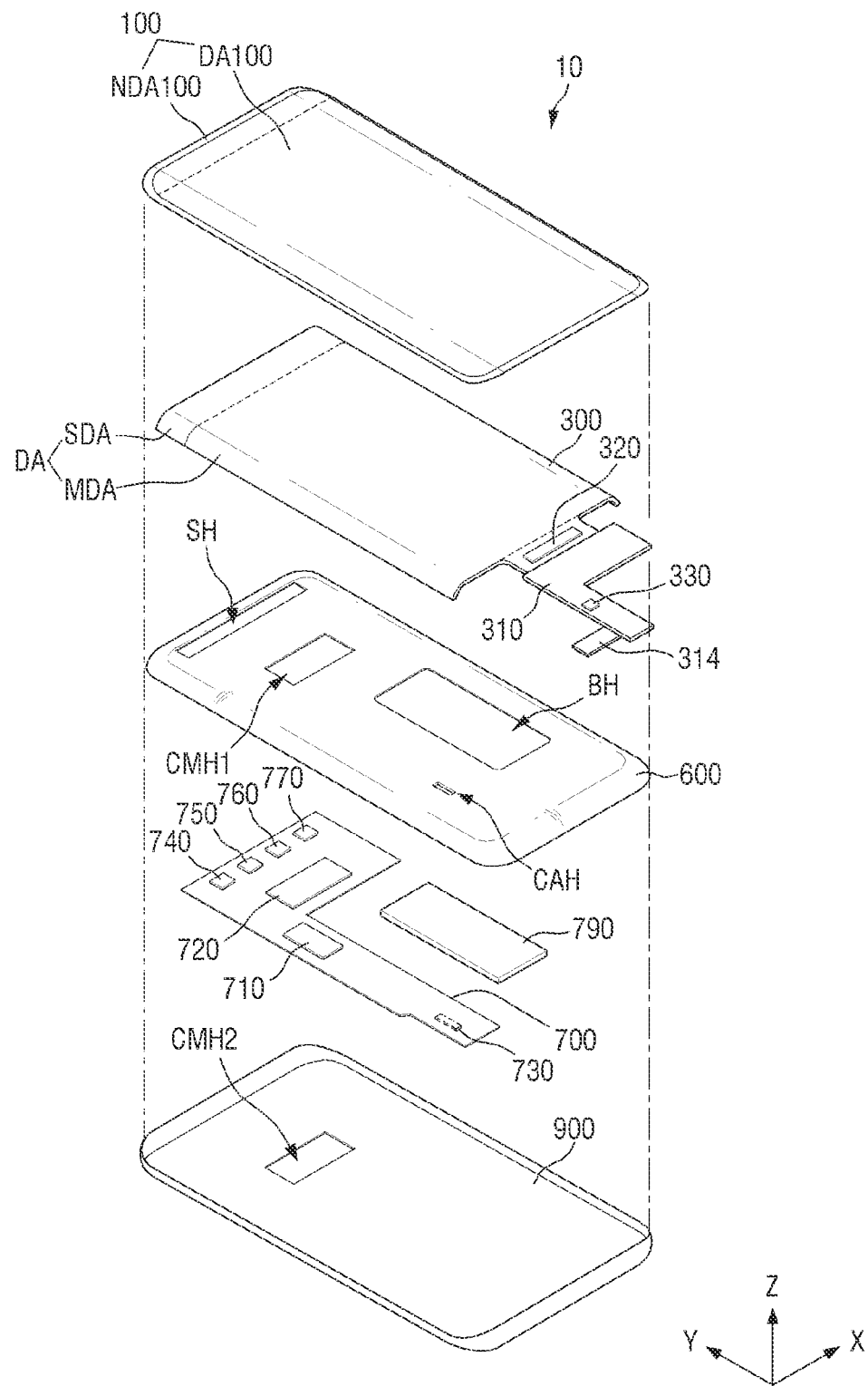
FIG. 2 is an exploded perspective view of the display device according to an embodiment.

FIG. 1 is a perspective view of a display device 10 according to an embodiment. FIG. 2 is an exploded perspective view of the display device 10 according to an embodiment.

Referring to FIGS. 1 and 2, the display device 10 according to the present embodiment may be applied to various suitable portable electronic devices, for example, such as mobile phones, smartphones, tablet personal computers (PCs), mobile communication terminals, electronic notebooks, electronic books, portable multimedia players (PMPs), navigation devices, ultra-mobile PCs (UMPCs), and the like. As another example, the display device 10 according to the present embodiment may be applied as a display unit of a television, a notebook computer, a monitor, a billboard, an Internet of things (IoT) device, and the like. As another example, the display device 10 according to the present embodiment may be applied to various suitable wearable devices, for example, such as smart watches, watch phones, glass-like displays, head-mounted displays (HMDs), and the like. As another example, the display device 10 according to the present embodiment may be applied to a dashboard of a vehicle, a center fascia of a vehicle, a center information display (CID) disposed on a dashboard of a vehicle, a room mirror display in place of a side mirror of a vehicle, a display disposed on the back of a front seat as an entertainment for a rear seat of a vehicle, and the like.

In the present specification, a first direction (e.g., an X-axis direction) may be a short side direction of the display device 10, for example, a horizontal direction of the display device 10. A second direction (e.g., a Y-axis direction) may be a long side direction of the display device 10, for example, a vertical direction of the display device 10. A third direction (e.g., a Z-axis direction) may be a thickness direction of the display device 10.

The display device 10 may have a planar shape similar to (e.g., or the same as or substantially the same as) a quadrangular shape. For example, the display device 10 may have a planar shape similar to a quadrangular shape having short sides in the first direction (e.g., the X-axis direction) and long sides in the second direction (e.g., the Y-axis direction) as illustrated in FIG. 1. Each corner where a short side extending in the first direction (e.g., the X-axis direction) meets a long side extending in the second direction (e.g., the Y-axis direction) may be rounded with a suitable curvature (e.g., a predetermined curvature) or may be right-angled. However, the present disclosure is not limited thereto, and the planar shape of the display device 10 is not limited to the quadrangular shape. For example, the planar shape of the display device 10 may be any suitable shape, for example, such as another polygonal shape, a circular shape, an oval shape, and/or the like.

The display device 10 may be formed to be flat or substantially flat. In another example, the display device 10 may be formed, for example, such that two facing sides thereof are bent (or curved). For example, the display device 10 may be formed such that left and right sides are bent (or curved). In another example, the display device 10 may be formed such that all of the upper, lower, left and right sides thereof are bent (or curved).

The display device 10 according to the present embodiment includes a cover window 100, a display panel 300, a display circuit board 310, a display driving circuit 320, a bracket 600, a main circuit board 700, one or more optical devices 740 through 770, and a bottom cover 900.

The cover window 100 may be disposed on the display panel 300 to cover a front surface of the display panel 300. Thus, the cover window 100 may function to protect the front surface of the display panel 300.

The cover window 100 may include a light transmitting part (e.g., a light transmitting area) DA100 corresponding to the display panel 300, and a light blocking part (e.g., a light blocking area) NDA100 corresponding to an area other than the display panel 300. The light blocking part NDA100 may be formed to be opaque. In another example, the light blocking part NDA100 may be formed as a decorative layer having a pattern that may be shown to a user when an image is not displayed.

The display panel 300 may be disposed under the cover window 100. The display panel 300 may include a display area DA including a main display area MDA and a sub-display area SDA. The main display area MDA may occupy most of (e.g., a majority of) the display area DA. The sub-display area SDA may be disposed at (e.g., in or on) a side (e.g., an end) of the main display area MDA, for example, at an upper side (e.g., an upper end) of the main display area MDA as illustrated in FIG. 2, but the present disclosure is not limited thereto. For example, in other embodiments, the sub-display area SDA may be disposed at (e.g., in or on) at least two opposite sides (e.g., two opposite ends) of the main display area MDA, or at (e.g., in or on) at least two adjacent sides (e.g., two adjacent ends) of the main display area MDA.

The main display area MDA may include a pixel area that includes pixels for displaying an image, but may not include a transmissive area that transmits light therethrough. On the other hand, the sub-display area SDA may include both a transmissive area that transmits light therethrough and a pixel area that includes pixels for displaying an image. Therefore, light transmittance of the sub-display area SDA may be higher than that of the main display area MDA.

The sub-display area SDA may overlap with the one or more optical devices 740 through 770 in the third direction (e.g., the Z-axis direction). Thus, light passing through the sub-display area SDA may be incident on the one or more optical devices 740 through 770. Therefore, although each of the optical devices 740 through 770 is overlapped by (e.g., overlaps with) the display panel 300, one or more of the optical devices 740 through 770 (e.g., each of the optical devices 740 through 770) may sense light incident from a front surface of the display device 10.

The display panel 300 may be a light emitting display panel including light emitting elements. For example, the display panel 300 may be an organic light emitting display panel including organic light emitting diodes that include organic light emitting layers, a micro light emitting diode display panel including micro light emitting diodes, a quantum dot light emitting display panel including quantum dot light emitting diodes that include quantum dot light emitting layers, or an inorganic light emitting display panel including inorganic light emitting elements that include inorganic semiconductors. For convenience of description, a case where the display panel 300 is an organic light emitting display panel will be mainly described in more detail below.

The display circuit board 310 and the display driving circuit 320 may be connected to (e.g., attached to or mounted on) a side of the display panel 300. The display circuit board 310 may be a flexible printed circuit board that can be bent (or folded), a rigid printed circuit board that is hard and not easily bent, or a composite printed circuit board including both a rigid printed circuit board and a flexible printed circuit board.

The display driving circuit 320 may receive control signals and power voltages through the display circuit board 310, and may generate and output signals and voltages for driving the display panel 300. The display driving circuit 320 may be formed as an integrated circuit and attached onto (e.g., mounted on) the display panel 300 using a chip-on-glass (COG) method, a chip-on-plastic (COP) method, or an ultrasonic bonding method. However, the present disclosure is not limited thereto. For example, the display driving circuit 320 may be attached onto (e.g., mounted on) the display circuit board 310.

A touch driving circuit 330 may be disposed on the display circuit board 310. The touch driving circuit 330 may be formed as an integrated circuit and attached onto (e.g., mounted on) an upper surface of the display circuit board 310. The touch driving circuit 330 may be electrically connected to touch electrodes of a touch sensor layer of the display panel 300 through the display circuit board 310. The touch driving circuit 330 may output a touch driving signal to the touch electrodes, and may sense a voltage charged in a capacitance of each touch electrode.

The touch driving circuit 330 may generate touch data according to a change in an electrical signal sensed at each of the touch electrodes, and may transmit the touch data to a main processor 710. The main processor 710 may analyze the touch data to calculate touch coordinates at which a touch has occurred. A touch may include a contact touch and/or a proximity touch. The contact touch refers to a case where an object, for example, such as a human finger or a pen directly contacts the cover window 100 disposed on the touch sensor layer. The proximity touch refers to a case where an object, for example, such as a human finger or a pen is positioned above (e.g., hovers over) the cover window 100 in a suitable or desired proximity to the cover window 100.

In addition, a power supply unit (e.g., a power supply or a power supply circuit) for supplying display driving voltages for driving the display driving circuit 320 may be disposed on the display circuit board 310.

The bracket 600 may be disposed under the display panel 300. The bracket 600 may include plastic, metal, or both plastic and metal. The bracket 600 may include a first camera hole CMH1 into which a first camera sensor 720 is inserted, a battery hole BH in which a battery 790 is disposed, a cable hole CAH through which a cable 314 connected to the display circuit board 310 passes, and a light transmission hole SH in which the optical devices 740 through 770 are disposed. In another example, the bracket 600 may be formed not to overlap with the sub-display area SDA of the display panel 300, and in this example, may not include the light transmission hole SH.

The main circuit board 700 and the battery 790 may be disposed under the bracket 600. The main circuit board 700 may be a printed circuit board or a flexible printed circuit board.

The main circuit board 700 may include the main processor 710, the first camera sensor 720, a main connector 730, and the one or more optical devices 740 through 770. The optical devices 740 through 770 may include a proximity sensor 740, an illuminance sensor 750, an iris sensor 760, and a second camera sensor 770.

The first camera sensor 720 may be disposed on both an upper surface and a lower surface of the main circuit board 700. The main processor 710 may be disposed on the upper surface of the main circuit board 700. The main connector 730 may be disposed on the lower surface of the main circuit board 700. The proximity sensor 740, the illuminance sensor 750, the iris sensor 760, and the second camera sensor 770 may be disposed on the upper surface of the main circuit board 700.

The main processor 710 may control the functions (e.g., all functions) of the display device 10. For example, the main processor 710 may output digital video data to the display driving circuit 320 through the display circuit board 310 so that the display panel 300 can display an image. In addition, the main processor 710 may receive touch data from the touch driving circuit 330, may determine touch coordinates of a user, and then may execute an application indicated by an icon displayed at the touch coordinates of the user. In addition, the main processor 710 may convert first image data received from the first camera sensor 720 into digital video data, and may output the digital video data to the display driving circuit 320 through the display circuit board 310. Thus, an image captured by the first camera sensor 720 may be displayed on the display panel 300. Further, the main processor 710 may control the display device 10 according to sensor signals received from the proximity sensor 740, the illuminance sensor 750, the iris sensor 760, and the second camera sensor 770.

The main processor 710 may determine whether an object is located close to (e.g., adjacent to or within a suitable proximity to) the front surface of the display device 10 according to a proximity sensor signal received from the proximity sensor 740. When an object is located close to the front surface of the display device 10 in a call mode in which a user communicates with (e.g., talks to) another party using the display device 10, the main processor 710 may not execute an application indicated by an icon displayed at touch coordinates even if the user performs a touch action.

The main processor 710 may determine the brightness of the front surface of the display device 10 according to an illuminance sensor signal received from the illuminance sensor 750. The main processor 710 may adjust the luminance of an image displayed on the display panel 300 according to the brightness of the front surface of the display device 10.

The main processor 710 may determine whether an iris image of a user is identical to (e.g., the same or substantially the same as) an iris image pre-stored in a memory according to an iris sensor signal received from the iris sensor 760. When the iris image of the user is identical to the iris image pre-stored in the memory, the main processor 710 may unlock the display device 10 and may display a home screen on the display panel 300.

The main processor 710 may generate digital video data according to second image data received from the second camera sensor 770. The main processor 710 may output the digital video data to the display driving circuit 320 through the display circuit board 310. Thus, an image captured by the second camera sensor 770 may be displayed on the display panel 300.

The first camera sensor 720 may process an image frame such as a still image or a moving image obtained by an image sensor, and may output the processed image frame to the main processor 710. The first camera sensor 720 may be a complementary metal-oxide-semiconductor (CMOS) image sensor or a charge-coupled device (CCD) sensor. The first camera sensor 720 may be exposed on a lower surface of the bottom cover 900 by a second camera hole CMH2. Thus, the first camera sensor 720 may photograph an object or background disposed at a rear surface of the display device 10.

The cable 314 passing through the cable hole CAH of the bracket 600 may be connected to the main connector 730. Therefore, the main circuit board 700 may be electrically connected to the display circuit board 310.

The proximity sensor 740 is a sensor for detecting whether an object is located close to (e.g., adjacent to or within a suitable proximity to) the front surface of the display device 10. The proximity sensor 740 may include a light source which outputs light, and a light reception unit (e.g., a light receptor or a light receiver) which receives light reflected by an object. The proximity sensor 740 may determine whether there is an object located close to the front surface of the display device 10 according to the amount of light reflected by the object. Because the proximity sensor 740 overlaps with (e.g., is overlapped by) the light transmission hole SH, the sub-display area SDA of the display panel 300, and the light transmitting part DA100 of the cover window 100 in the third direction (e.g., the Z-axis direction), the proximity sensor 740 may generate a proximity sensor signal according to whether there is an object located close to the front surface of the display device 10 and may output the proximity sensor signal to the main processor 710.

The illuminance sensor 750 is a sensor for detecting the brightness of the front surface of the display device 10. The illuminance sensor 750 may include a resistor having a resistance value that varies according to the brightness of incident light. The illuminance sensor 750 may determine the brightness of the front surface of the display device 10 according to the resistance value of the resistor. Because the illuminance sensor 750 overlaps with (e.g., is overlapped by) the light transmission hole SH, the sub-display area SDA of the display panel 300, and the light transmitting part DA100 of the cover window 100 in the third direction (e.g., the Z-axis direction), the illuminance sensor 750 may generate an illuminance sensor signal according to the brightness of the front surface of the display device 10 and may output the illuminance sensor signal to the main processor 710.

The iris sensor 760 is a sensor for detecting whether a photographed image of a user's iris is identical to (e.g., the same or substantially the same as) an iris image pre-stored in the memory. Because the iris sensor 760 overlaps with (e.g., is overlapped by) the light transmission hole SH, the sub-display area SDA of the display panel 300, and the light transmitting part DA100 of the cover window 100 in the third direction (e.g., the Z-axis direction), the iris sensor 760 may photograph the user's iris disposed above (e.g., at the front surface of) the display device 10. The iris sensor 760 may generate an iris sensor signal according to whether the iris image of the user is identical to the iris image pre-stored in the memory, and may output the iris sensor signal to the main processor 710.

The second camera sensor 770 may process an image frame such as a still image or a moving image obtained by an image sensor, and may output the processed image frame to the main processor 710. The second camera sensor 770 may be a CMOS image sensor or a CCD sensor. The number of pixels of the second camera sensor 770 may be smaller than (e.g., less than) the number of pixels of the first camera sensor 720, and a size of the second camera sensor 770 may be smaller than a size of the first camera sensor 720. Because the second camera sensor 770 overlaps with (e.g., is overlapped by) the light transmission hole SH, the sub-display area SDA of the display panel 300, and the light transmitting part DA100 of the cover window 100 in the third direction (e.g., the Z-axis direction), the second camera sensor 770 may photograph an object or background disposed above (e.g., at the front surface of) the display device 10.

The battery 790 may be disposed not to overlap with the main circuit board 700 in the third direction (e.g., the Z-axis direction). The battery 790 may overlap with the battery hole BH of the bracket 600.

In addition, the main circuit board 700 may further include a mobile communication module (e.g., a mobile communication antenna or transceiver) capable of transmitting and receiving wireless signals to and from at least one of a base station, an external terminal, or a server over a mobile communication network. The wireless signals may include voice signals, video call signals, various kinds of data, and/or the like according to transmission/reception of text/multimedia messages.

The bottom cover 900 may be disposed under the main circuit board 700 and the battery 790. The bottom cover 900 may be fastened and fixed to the bracket 600. The bottom cover 900 may form the bottom exterior of the display device 10. The bottom cover 900 may include plastic, metal, or both plastic and metal.

The second camera hole CMH2 exposing a lower surface of the first camera sensor 720 may be formed in the bottom cover 900. However, the present disclosure is not limited to the position of the first camera sensor 720 and the positions of the first and second camera holes CMH1 and CMH2 corresponding to the first camera sensor 720 shown in the embodiment illustrated in FIG. 2.

Figure 3:
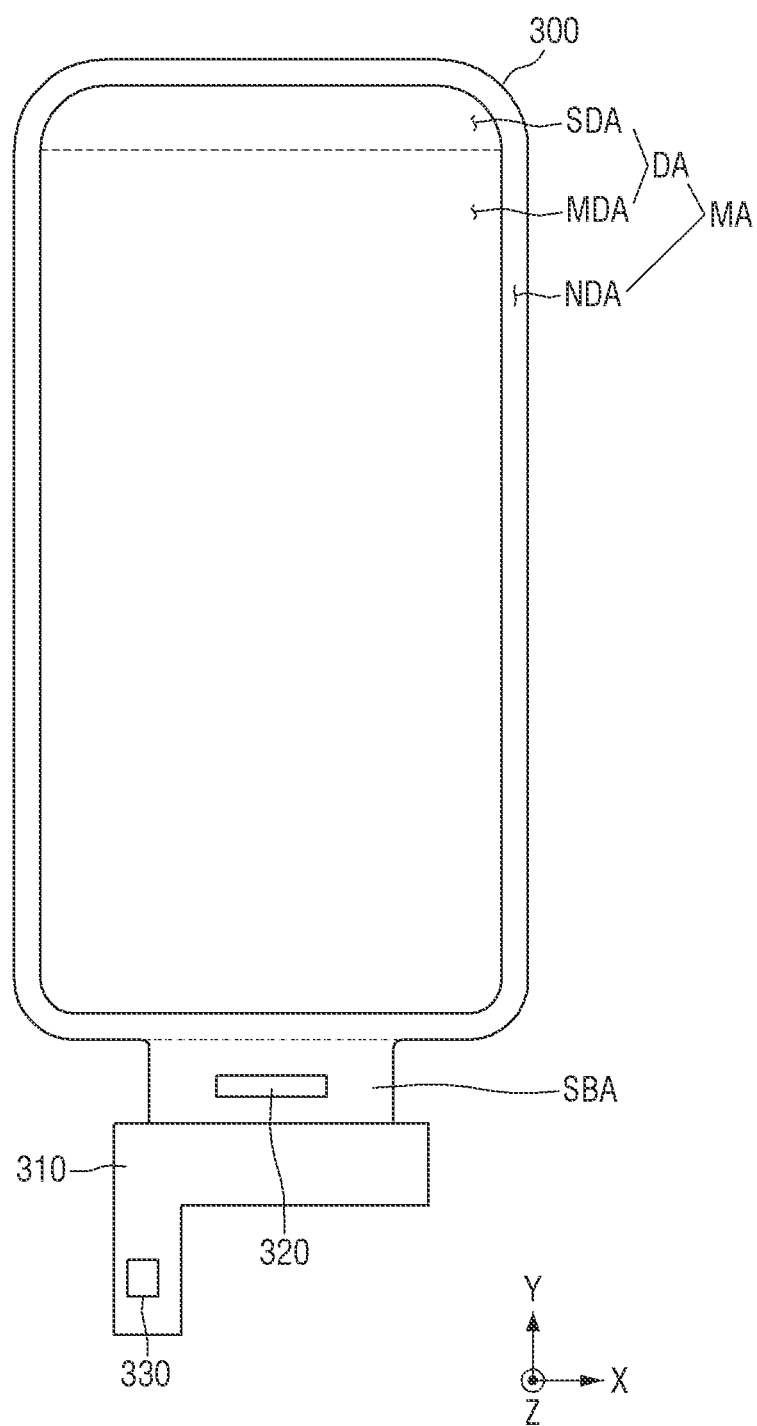
FIG. 3 is a plan view illustrating a display panel, a display circuit board, a display driving circuit, and a touch driving circuit according to an embodiment.
Figure 4:
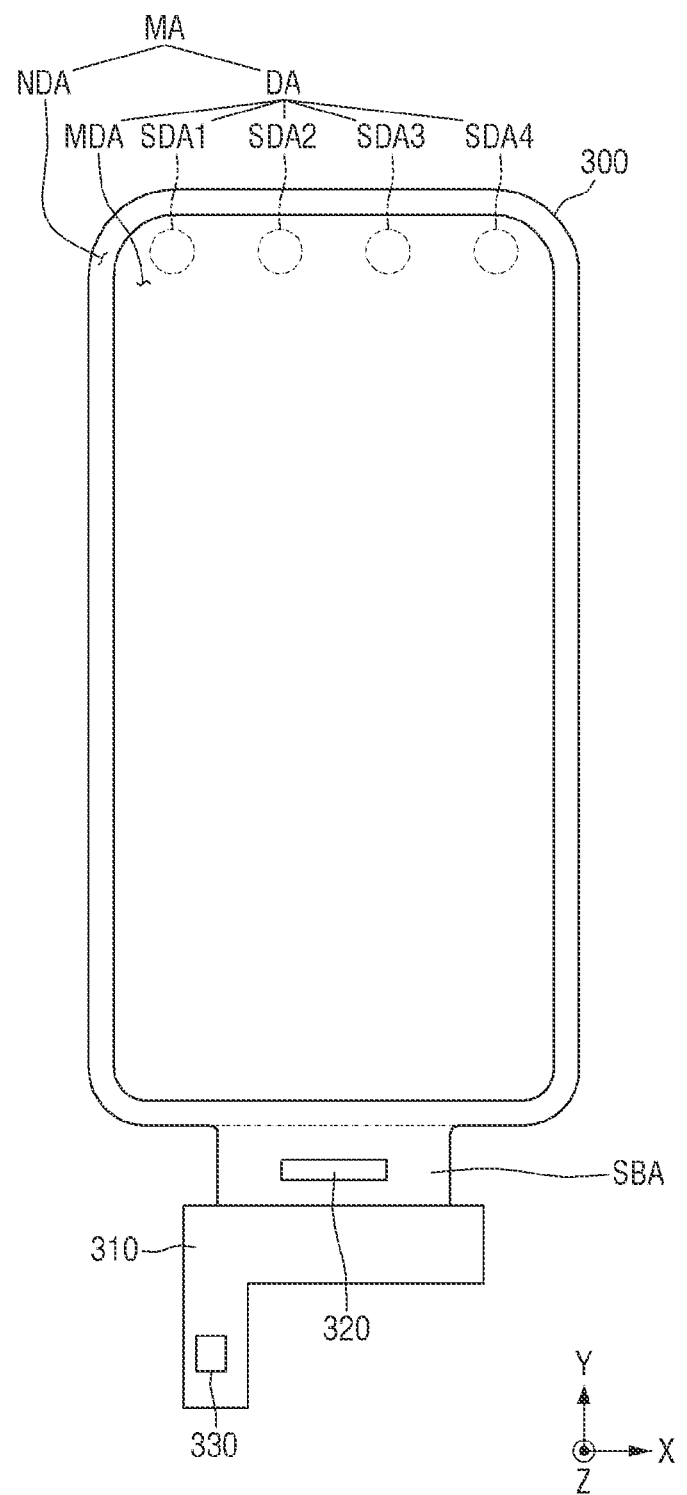
FIG. 4 is a plan view illustrating a display panel, a display circuit board, a display driving circuit, and a touch driving circuit according to an embodiment.

FIG. 3 is a plan view illustrating the display panel 300, the display circuit board 310, the display driving circuit 320, and the touch driving circuit 330 according to an embodiment. FIG. 4 is a plan view illustrating the display panel 300, the display circuit board 310, the display driving circuit 320, and the touch driving circuit 330 according to an embodiment.

Referring to FIG. 3, the display panel 300 may be a rigid display panel that is hard and not easily bent (or folded), or a flexible display panel that is flexible and may be easily bent, folded, or rolled. For example, the display panel 300 may be a foldable display panel that may be folded and unfolded, a curved display panel having a display surface that is curved, a bent display panel having areas other than a display surface that are bent, a rollable display panel that may be rolled and/or unrolled, a stretchable display panel that may be stretched and/or unstretched, and/or the like.

In addition, the display panel 300 may be a transparent display panel that is implemented to be transparent so that an object or background disposed on a lower surface (e.g., located at the rear surface) of the display panel 300 may be viewed (e.g., may be seen) from the front surface of the display panel 300. In addition, the display panel 300 may be a reflective display panel that may reflect an object or background at the front surface of the display panel 300.

The display panel 300 may include a main area MA and a sub area SBA protruding from a side (e.g., an end) of the main area MA. The main area MA may include the display area DA which displays an image, and a non-display area NDA which is disposed around (e.g., to surround a periphery of) the display area DA. The display area DA may occupy most of (e.g., a majority of) the main area MA. The display area DA may be disposed at the center (e.g., a central area) of the main area MA. The non-display area NDA may be an area outside the display area DA. The non-display area NDA may be defined as an edge area (e.g., a peripheral area) of the display panel 300.

The display area DA may include the main display area MDA and the sub-display area SDA. The main display area MDA may occupy most of (e.g., a majority of) the display area DA.

The main display area MDA may not include a transmissive area that transmits light therethrough, and may include a pixel area that includes pixels for displaying an image. On the other hand, the sub-display area SDA may include both a transmissive area that transmits light therethrough and a pixel area that includes pixels for displaying an image. Therefore, light transmittance of the sub-display area SDA may be higher than that of the main display area MDA.

The sub-display area SDA may overlap with the optical devices 740 through 770 in the third direction (e.g., the Z-axis direction). Thus, light passing through the sub-display area SDA may be incident on the optical devices 740 through 770. Therefore, although each of the optical devices 740 through 770 overlaps with (e.g., is overlapped by) the display panel 300, each of the optical devices 740 through 770 may sense light incident from the front surface of the display device 10.

The sub-display area SDA may be disposed on a side (e.g., on an end) of the main display area MDA, for example, on the upper side (e.g., the upper end) of the main display area MDA as illustrated in FIG. 3. However, the present disclosure is not limited thereto. For example, the sub-display area SDA may be disposed on a left side, a right side, or a lower side (e.g., a lower end) of the main display area MDA. In another example, the sub-display area SDA may be disposed adjacent to the center of the main display area MDA, and may be surrounded (e.g., around a periphery thereof) by the main display area MDA. In another example, the sub-display area SDA may be disposed adjacent to a corner of the display panel 300.

In another embodiment, referring to FIG. 4, the display area DA may include a plurality of sub-display areas SDA1 through SDA4, for example, as illustrated in FIG. 4. In this example, the sub-display areas SDA1 through SDA4 may be spaced apart from each other. Each of the sub-display areas SDA1 through SDA4 may be surrounded (e.g., around a periphery thereof) by the main display area MDA.

A first sub-display area SDA1 may overlap with the proximity sensor 740 in the third direction (e.g., the Z-axis direction). Therefore, although the proximity sensor 740 overlaps with (e.g., is overlapped by) the display panel 300, the proximity sensor 740 may sense light incident from the front surface of the display device 10 through the first sub-display area SDA1.

A second sub-display area SDA2 may overlap with the illuminance sensor 750 in the third direction (e.g., the Z-axis direction). Therefore, although the illuminance sensor 750 overlaps with (e.g., is overlapped by) the display panel 300, the illuminance sensor 750 may sense light incident from the front surface of the display device 10 through the second sub-display area SDA2.

A third sub-display area SDA3 may overlap with the iris sensor 760 in the third direction (e.g., the Z-axis direction). Therefore, although the iris sensor 760 overlaps with (e.g., is overlapped by) the display panel 300, the iris sensor 760 may sense light incident from the front surface of the display device 10 through the third sub-display area SDA3.

A fourth sub-display area SDA4 may overlap with the second camera sensor 770 in the third direction (e.g., the Z-axis direction). Therefore, although the second camera sensor 770 overlaps with (e.g., is overlapped by) the display panel 300, the second camera sensor 770 may sense light incident from the front surface of the display device 10 through the fourth sub-display area SDA4.

The display area DA may include four sub-display areas SDA1 through SDA4 as illustrated in FIG. 4, but the present disclosure is not limited thereto. The number of sub-display areas SDA1 through SDA4 may depend on the number of optical devices 740 through 770 of the display device 10. For example, the sub-display areas SDA1 through SDA4 may be disposed to correspond one-to-one with the optical devices 740 through 770.

Each of the sub-display areas SDA1 through SDA4 may be circular as illustrated in FIG. 4, but the present disclosure is not limited thereto. For example, each of the sub-display areas SDA1 through SDA4 may have any suitable shape, for example, such as a polygonal shape, an oval shape, and/or the like. In addition, the sub-display areas SDA1 through SDA4 may have the same or substantially the same size as each other as illustrated in FIG. 4, but the present disclosure is not limited thereto. For example, at least one of the sub-display areas SDA1 through SDA4 may have a different size from those of the others.

The sub area SBA may protrude in the second direction (e.g., the Y-axis direction) from a side (e.g., an end) of the main area MA. As illustrated in FIGS. 3 and 4, a length of the sub area SBA in the first direction (e.g., the X-axis direction) may be smaller than a length of the main area MA in the first direction (e.g., the X-axis direction), and a length of the sub area SBA in the second direction (e.g., the Y-axis direction) may be smaller than a length of the main area MA in the second direction (e.g., the Y-axis direction), but the present disclosure is not limited thereto.

The sub area SBA of the display panel 300 may be bent (or folded) and disposed under the display panel 300. In this case, the sub area SBA of the display panel 300 may overlap with (e.g., may be overlapped by) the main area MA of the display panel 300 in the third direction (e.g., the Z-axis direction).

The display circuit board 310 and the display driving circuit 320 may be attached to (e.g., mounted on) the sub area SBA of the display panel 300. The display circuit board 310 may be attached onto pads of the sub area SBA of the display panel 300 by using a low-resistance high-reliability material, for example, such as an anisotropic conductive film or a self-assembly anisotropic conductive paste (SAP). The touch driving circuit 330 may be disposed on the display circuit board 310.

Figure 5:
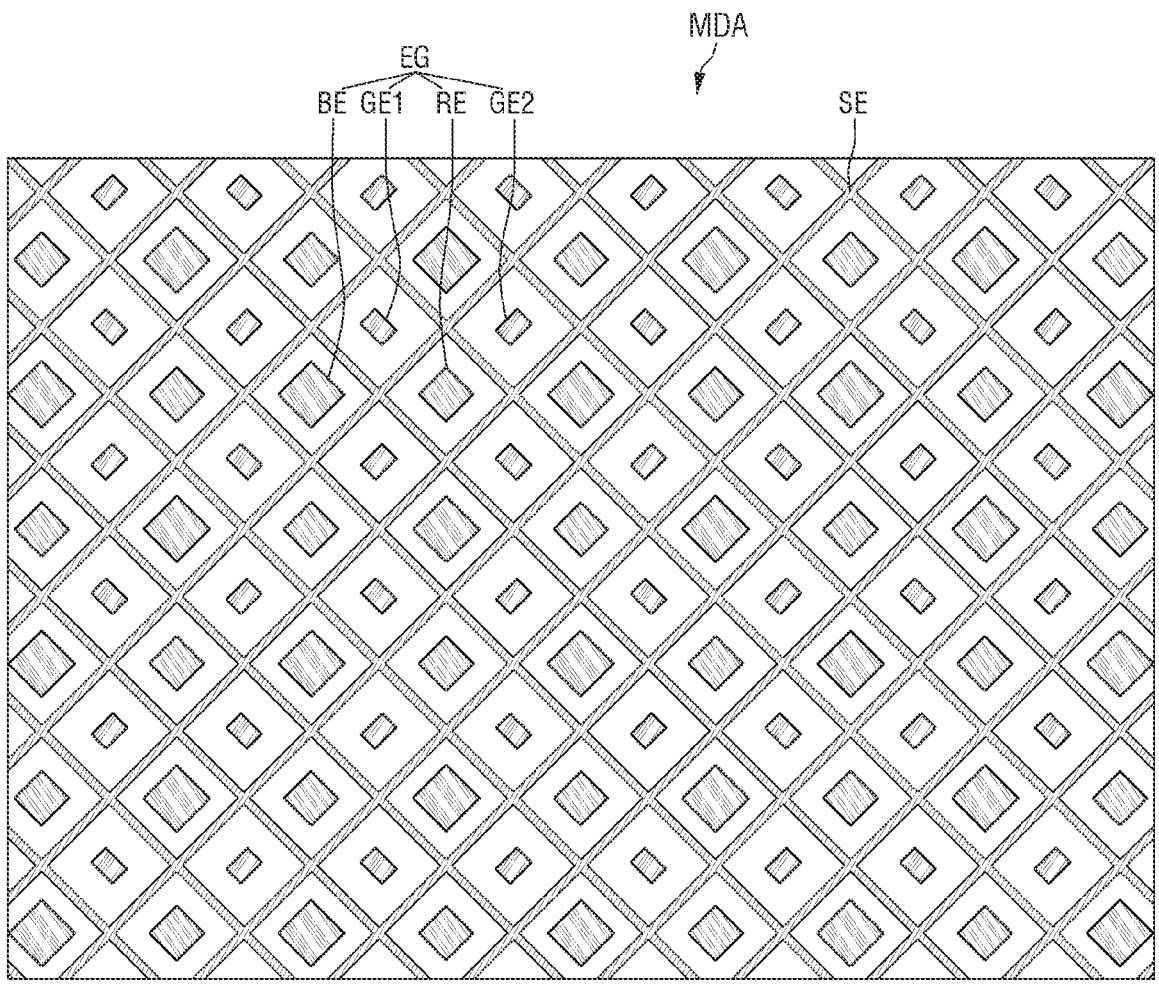
FIG. 5 is a layout view of a main display area of the display panel according to an embodiment.
Figure 5:
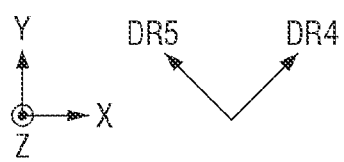

FIG. 5 is a layout view of the main display area MDA of the display panel 300 according to an embodiment.

Referring to FIG. 5, the main display area MDA may include emission areas RE, GE1, BE, and GE2, which emit light. The emission areas RE, GE1, BE, and GE2 of the main display area MDA may include first emission areas RE that emit light of a first color, second emission areas GE1 that emit light of a second color, third emission areas BE that emit light of a third color, and fourth emission areas GE2 that emit light of a fourth color. The first through fourth emission areas RE, GE1, BE, and GE2 may emit light of different colors from each other. In another example, at least two of the first through fourth emission areas RE, GE1, BE, and GE2 may emit light of the same color as each other. For example, the second emission areas GE1 and the fourth emission areas GE2 may emit light of the same color as each other.

Each of the first emission areas RE, the second emission areas GE1, the third emission areas BE, and the fourth emission areas GE2 may have a rectangular planar shape, but the present disclosure is not limited thereto. For example, each of the first emission areas RE, the second emission areas GE1, the third emission areas BE, and the fourth emission areas GE2 may have any suitable shape, such as another polygonal shape other than the rectangular shape, a circular shape, an oval shape, and/or the like. In addition, in FIGS. 5 through 8, the area of each third emission area BE is illustrated as being the largest, and the area of each second emission area GE1 and the area of each fourth emission area GE2 are illustrated as being the smallest, but the present disclosure is not limited thereto.

One first emission area RE, one second emission area GE1, one third emission area BE, and one fourth emission area GE2 may be defined as one pixel emission group EG for expressing a white gray level (e.g., a white grayscale value). In other words, light emitted from one first emission area RE, light emitted from one second emission area GE1, light emitted from one third emission area BE, and light emitted from one fourth emission area GE2 may be combined to express the white gray level.

Each of the first emission areas RE may be included in a corresponding first subpixel, each of the second emission areas GE1 may be included in a corresponding second subpixel, each of the third emission areas BE may be included in a corresponding third subpixel, and each of the fourth emission areas GE2 may be included in a corresponding fourth subpixel. The first subpixel, the second subpixel, the third subpixel, and the fourth subpixel may be defined as (e.g., may form) one pixel. The first subpixel, the second subpixel, the third subpixel, and the fourth subpixel will be described in more detail below with reference to FIG. 8.

The second emission areas GE1 and the fourth emission areas GE2 may be disposed at (e.g., in or on) odd-numbered rows. The second emission areas GE1 and the fourth emission areas GE2 may be disposed side by side in the first direction (e.g., the X-axis direction) in each of the odd-numbered rows. The second emission areas GE1 and the fourth emission areas GE2 may be alternately disposed at (e.g., in or on) each of the odd-numbered rows. Each of the fourth emission areas GE2 may have long sides extending in a fourth direction DR4 and short sides extending in a fifth direction DR5, and each of the second emission areas GE1 may have long sides extending in the fifth direction DR5 and short sides extending in the fourth direction DR4. The fourth direction DR4 may be a direction between the first direction (e.g., the X-axis direction) and the second direction (e.g., the Y-axis direction), and the fifth direction DR5 may be a direction intersecting (e.g., crossing) the fourth direction DR4.

The first emission areas RE and the third emission areas BE may be disposed at (e.g., in or on) even-numbered rows. The first emission areas RE and the third emission areas BE may be disposed side by side in the first direction (e.g., the X-axis direction) in each of the even-numbered rows. The first emission areas RE and the third emission areas BE may be alternately disposed at (e.g., in or on) each of the even-numbered rows. Each of the first emission areas RE and the third emission areas BE may have a rhombic planar shape. In this case, each of the first emission areas RE and the third emission areas BE may include sides that are parallel to or substantially parallel to the fourth direction DR4 and sides that are parallel to or substantially parallel to the fifth direction DR5.

The second emission areas GE1 and the fourth emission areas GE2 may be disposed at (e.g., in or on) even-numbered columns. The second emission areas GE1 and the fourth emission areas GE2 may be disposed side by side in the second direction (e.g., the Y-axis direction) in each of the even-numbered columns. The second emission areas GE1 and the fourth emission areas GE2 may be alternately disposed at (e.g., in or on) each of the even-numbered columns.

The first emission areas RE and the third emission areas BE may be disposed at (e.g., in or on) odd-numbered columns. The first emission areas RE and the third emission areas BE may be disposed side by side in the second direction (e.g., the Y-axis direction) in each of the odd-numbered columns. The first emission areas RE and the third emission areas BE may be alternately disposed at (e.g., in or on) each of the odd-numbered columns.

A touch electrode SE may have a mesh structure or a net structure in a plan view. The touch electrode SE may be disposed between the emission areas RE, GE1, BE, and GE2. The touch electrode SE may extend in the fourth direction DR4 and the fifth direction DR5. Because the touch electrode SE has a mesh structure or a net structure in a plan view, the emission areas RE, GE1, BE, and GE2 may not overlap with the touch electrode SE. Therefore, light emitted from the emission areas RE, GE1, BE, and GE2 may be prevented or substantially prevented from being blocked (e.g., may not be blocked) by the touch electrode SE, and thus, a reduction in luminance may be prevented or substantially prevented.

Figure 6:
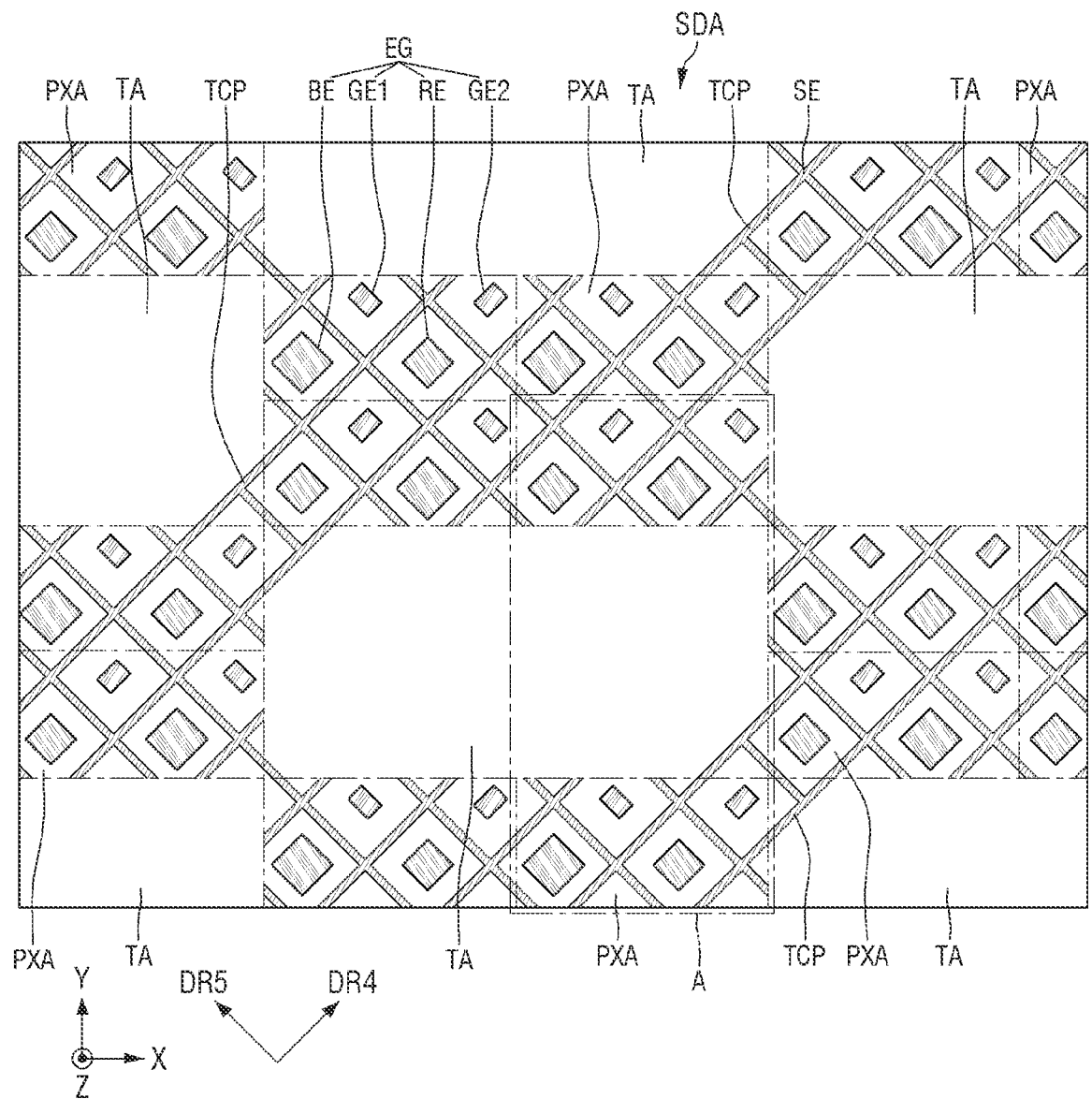
FIG. 6 is a layout view of a sub-display area of the display panel according to an embodiment.
Figure 7:
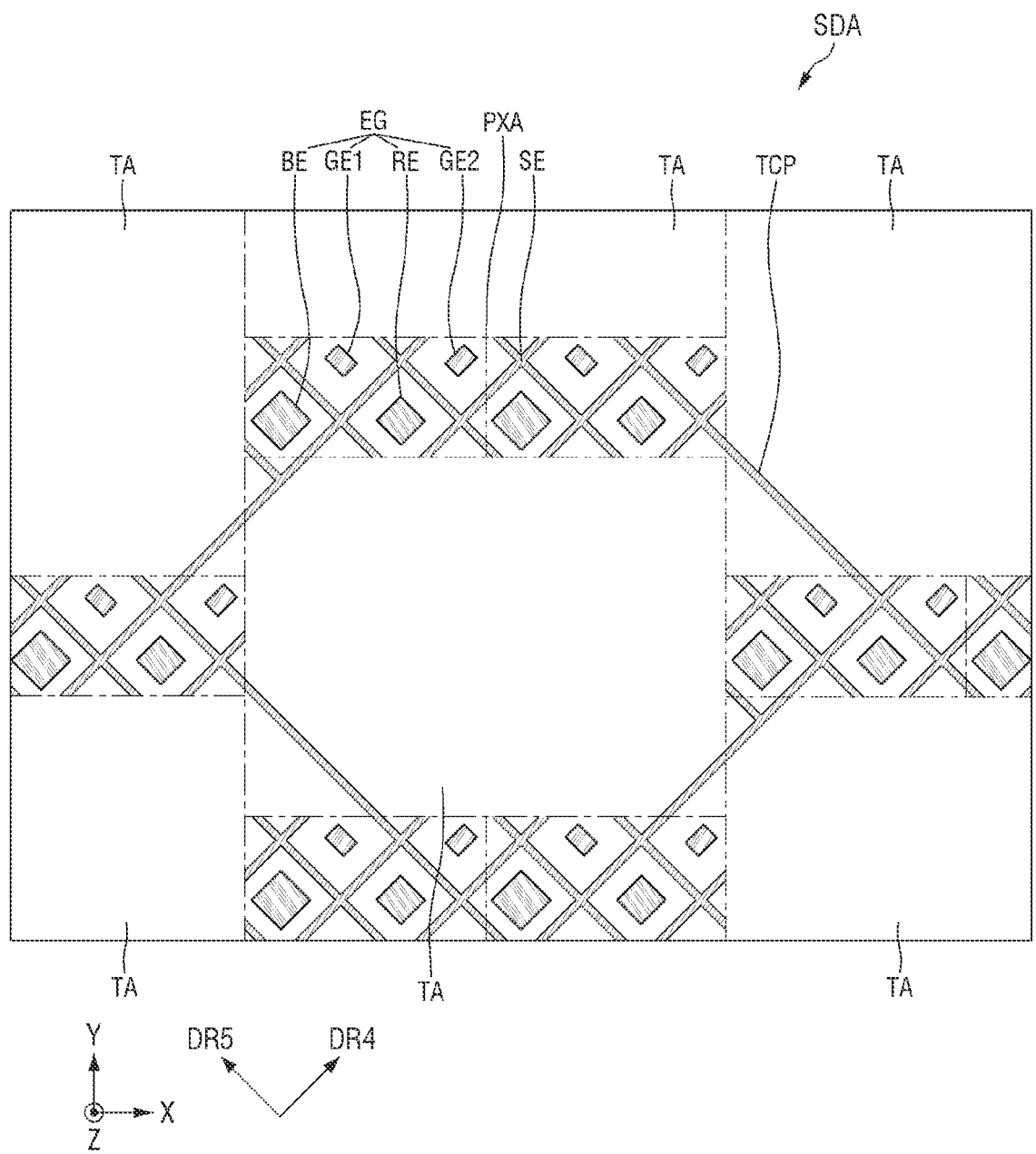
FIG. 7 is a layout view of a sub-display area of the display panel according to an embodiment.

FIG. 6 is a layout view of the sub-display area SDA of the display panel 300 according to an embodiment. FIG. 7 is a layout view of the sub-display area SDA of the display panel 300 according to an embodiment.

Referring to FIG. 6, the sub-display area SDA may include pixel areas PXA that include emission areas RE, GE1, BE, and GE2 for emitting light, and transmissive areas TA that transmit light.

The transmissive areas TA may be disposed adjacent to the pixel areas PXA. The pixels areas PXA and the transmissive areas TA may be disposed side by side in the first direction (e.g., the X-axis direction). The pixel areas PXA and the transmissive areas TA may be alternately disposed in the first direction (e.g., the X-axis direction). In addition, the pixel areas PXA and the transmissive areas TA may be disposed side by side in the second direction (e.g., the Y-axis direction). The pixels areas PXA and the transmissive areas TA may be alternately disposed in the second direction (e.g., the Y-axis direction).

Due to the transmissive areas TA, the number of emission areas RE, GE1, BE, and GE2 per unit area at (e.g., in or on) the sub-display area SDA may be smaller than the number of emission areas RE, GE1, BE, and GE2 per unit area at (e.g., in or on) the main display area MDA. In addition, due to the transmissive areas TA, a ratio of the area of the emission areas RE, GE1, BE, and GE2 of the sub-display area SDA to the area (e.g., the total area) of the sub-display area SDA may be smaller than a ratio of the area of the emission areas RE, GE1, BE, and GE2 of the main display area MDA to the area (e.g., the total area) of the main display area MDA. Each of the pixel areas PXA may include I pixel emission groups EG (where I is a positive integer). For example, each of the pixel areas PXA may include four pixel emission groups EG. In this case, in each of the pixel areas PXA, two pixel emission groups EG may be arranged in the first direction (e.g., the X-axis direction), and two pixel emission groups EG may be arranged in the second direction (e.g., the Y-axis direction). Because the emission areas RE, GE1, BE, and GE2 of each of the pixel emission groups EG are the same or substantially the same as those described with reference to FIG. 5, redundant description thereof may not be repeated.

The transmissive areas TA are areas through which light incident on the display panel 300 passes (e.g., is transmitted therethrough). The transmissive areas TA do not include the emission areas RE, GE1, BE, and GE2. As illustrated in FIGS. 6 and 7, touch electrodes SE may be excluded (e.g., may be removed) from the transmissive areas TA, and a touch connection pattern TCP for connecting the touch electrodes SE disposed in adjacent pixel areas PXA may be disposed at (e.g., in or on) the transmissive areas TA.

The transmissive areas TA may be surrounded (e.g., around a periphery thereof) by the pixel areas PXA. The area of each transmissive area TA may be the same or substantially the same as the area in which one I pixel emission groups EG is disposed. For example, the area of each transmissive area TA may be the same or substantially the same as the area in which four pixel emission groups EG are disposed as illustrated in FIG. 6. In this case, the number of emission areas RE, GE1, BE, and GE2 per unit area at (e.g., in or on) the sub-display area SDA may be half of the number of emission areas RE, GE1, BE, and GE2 per unit area at (e.g., in or on) the main display area MDA.

As another example, to increase light transmittance of the transmissive areas TA, the area of each transmissive area TA may be the same or substantially the same as the area in which six pixel emission groups EG are disposed as illustrated in FIG. 7. In this case, the number of emission areas RE, GE1, BE, and GE2 per unit area at (e.g., in or on) the sub-display area SDA may be a quarter of the number of emission areas RE, GE1, BE, and GE2 per unit area at (e.g., in or on) the main display area MDA.

The touch electrodes SE may have a mesh structure or a net structure in a plan view. The touch electrodes SE may be disposed between the emission areas RE, GE1, BE, and GE2. The touch electrodes SE may extend in the fourth direction DR4 and the fifth direction DR5. Because the touch electrodes SE have a mesh structure or a net structure in a plan view, the emission areas RE, GE1, BE, and GE2 may not overlap with the touch electrodes SE. Therefore, light emitted from the emission areas RE, GE1, BE, and GE2 may be prevented or substantially from being blocked (e.g., may not be blocked) by the touch electrodes SE, and thus, a reduction in luminance may be prevented or substantially prevented. In addition, the touch electrodes SE are not disposed at (e.g., in or on) the transmissive areas TA. Therefore, light passing through the transmissive areas TA may be prevented or substantially prevent from being blocked (e.g., may not be blocked) by the touch electrodes SE.

According to the embodiments illustrated in FIGS. 6 and 7, the optical devices 740 through 770 illustrated in FIG. 2 may be disposed in the sub-display area SDA of the display panel 300 including the transmissive areas TA. In this case, light incident from the front surface of the display device 10 may be sensed due to the transmissive areas TA.

Figure 8:
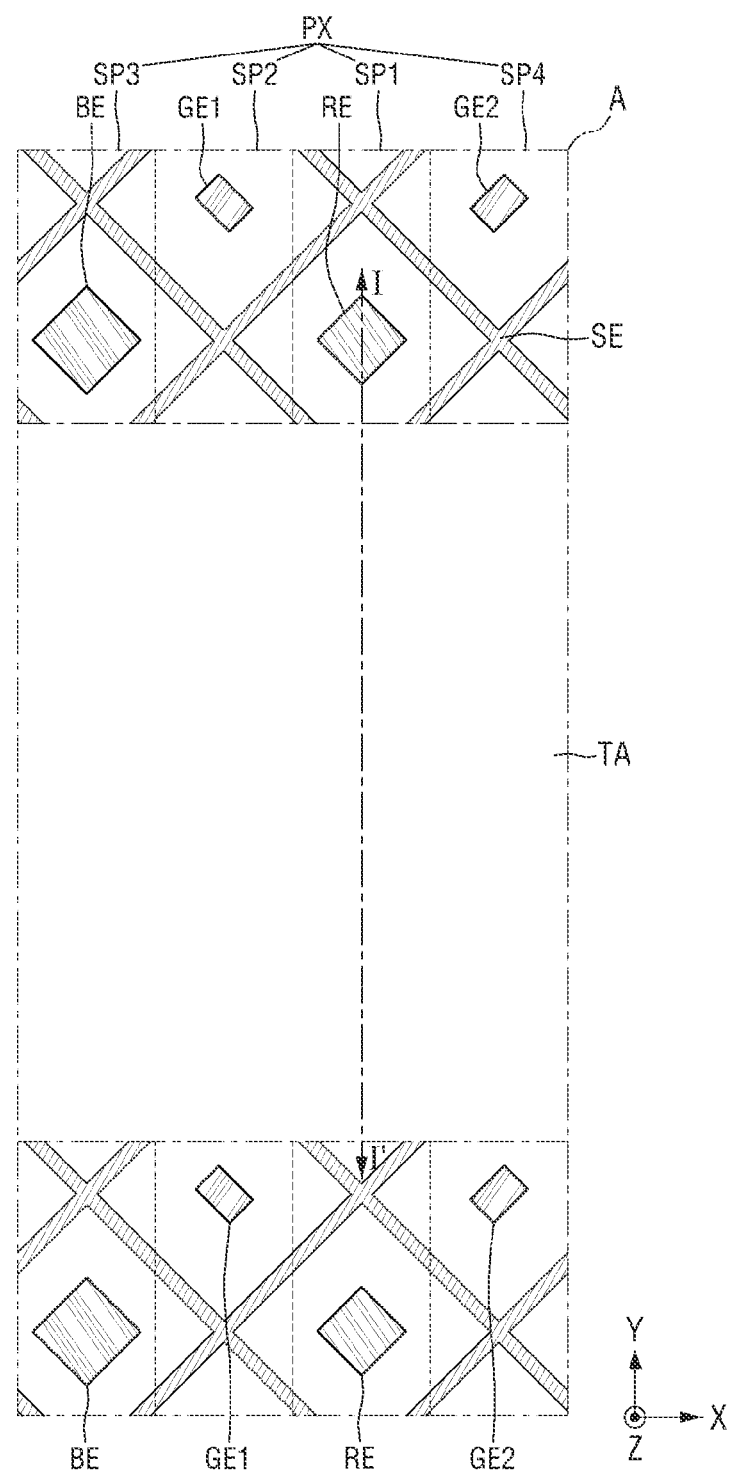
FIG. 8 is a layout view illustrating pixels and a transmissive area of FIG. 6 in more detail.

FIG. 8 is a layout view illustrating pixel areas PXA and a transmissive area TA of FIG. 6 in more detail. FIG. 8 is an enlarged view of the area A of FIG. 6.

Referring to FIG. 8, a pixel area PXA may be defined as an area at (e.g., in or on) which at least one pixel PX is disposed. In other words, the pixel area PXA may include at least one pixel PX. The pixel PX may include a plurality of subpixels SP1 through SP4 to express a white gray level (e.g., a white grayscale value). In other words, the pixel PX may be defined as a group of subpixels SP1 through SP4 for expressing the white gray level. Each of the subpixels SP1 through SP4 may be defined as a minimum unit capable of expressing a gray level. For example, the pixel PX may include four subpixels SP1 through SP4 as illustrated in FIG. 8, but the number of subpixels SP1 through SP4 included in the pixel PX is not limited thereto.

The pixel PX may include first through fourth subpixels SP1 through SP4. The first subpixel SP1 may include a first emission area RE that emits light of a first color. The second subpixel SP2 may include a second emission area GE1 that emits light of a second color. The third subpixel SP3 may include a third emission area BE that emits light of a third color. The fourth subpixel SP4 may include a fourth emission area GE2 that emits light of a fourth color.

Figure 9:
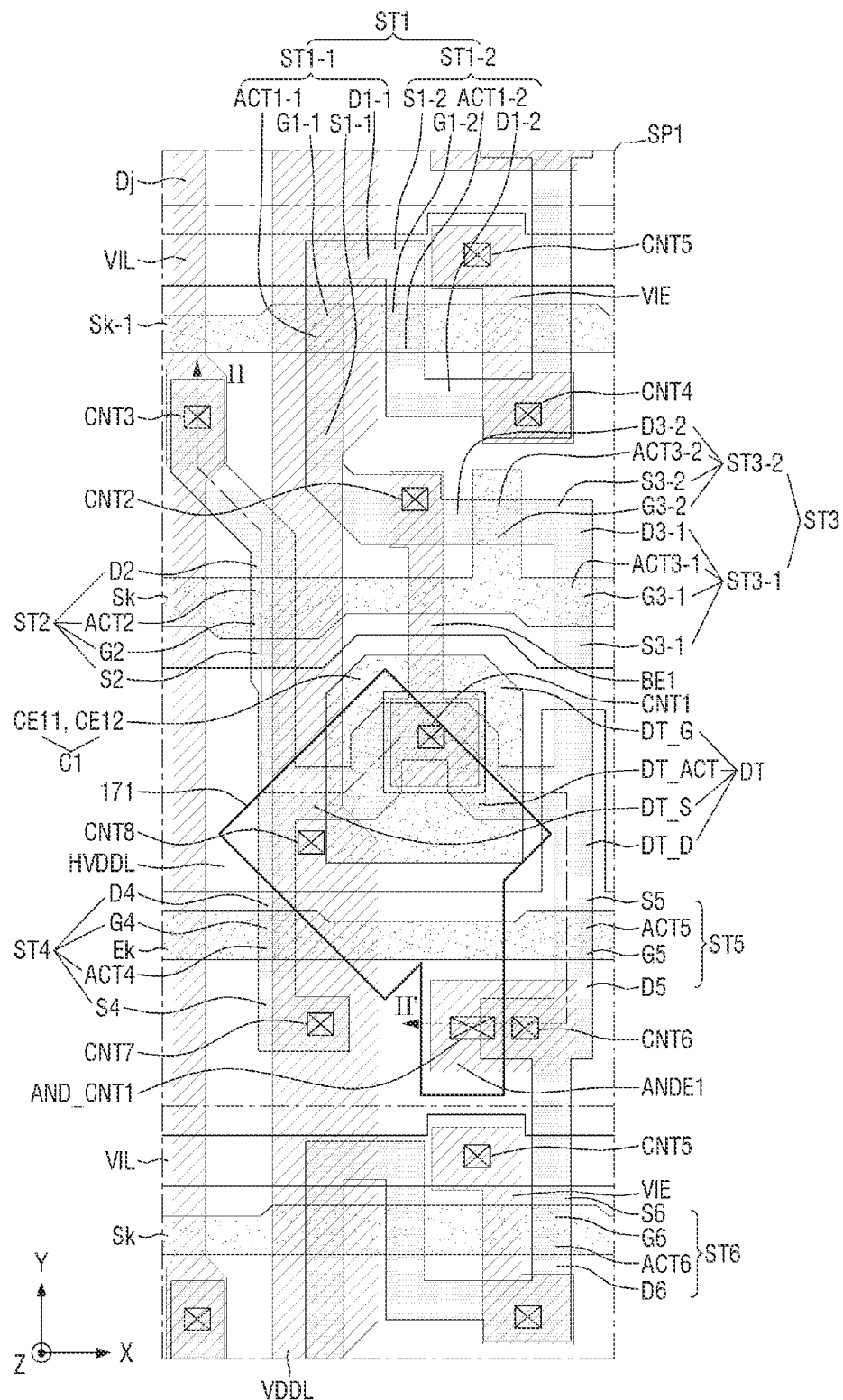
FIG. 9 is a detailed layout view of a first subpixel of FIG. 8.

In more detail, the first subpixel SP1 may refer to a minimum unit capable of expressing a gray level of the first color. To this end, as illustrated in FIG. 9, the first subpixel SP1 may include a plurality of transistors DT and ST1 through ST6 for applying a voltage or a current to the first emission area RE and a first light emitting electrode 171 of the first emission area RE. The second subpixel SP2 may refer to a minimum unit capable of expressing a gray level of the second color. To this end, the second subpixel SP2 may include a plurality of transistors DT and ST1 through ST6 for applying a voltage or a current to the second emission area GE1, and a first light emitting electrode 171 of the second emission area GE1. The third subpixel SP3 may refer to a minimum unit capable of expressing a gray level of the third color. To this end, the third subpixel SP3 may include a plurality of transistors DT and ST1 through ST6 for applying a voltage or a current to the third emission area BE and a first light emitting electrode 171 of the third emission area BE. The fourth subpixel SP4 may refer to a minimum unit capable of expressing a gray level of the fourth color. To this end, the fourth subpixel SP4 may include a plurality of transistors DT and ST1 through ST6 for applying a voltage or a current to the fourth emission area GE2, and a first light emitting electrode 171 of the fourth emission area GE2.

The first subpixel SP1 will now be described in more detail with reference to FIG. 9. The second subpixel SP2, the third subpixel SP3, and the fourth subpixel SP4 may have the same or substantially the same layout structure as that of the first subpixel SP1 of FIG. 9, except for the shape of the first light emitting electrode 171 corresponding to the shape of the respective emission area GE1, BE, or GE2, and thus, redundant description thereof may not be repeated.

FIG. 9 is a detailed layout view of the first subpixel SP1 of FIG. 8.

Referring to FIG. 9, the first subpixel SP1 may include a driving transistor DT, first through sixth transistors ST1 through ST6, and a first capacitor C1.

The driving transistor DT may include an active layer DT_ACT, a gate electrode DT_G, a first electrode DT_S, and a second electrode DT_D. The active layer DT_ACT of the driving transistor DT may overlap with the gate electrode DT_G of the driving transistor DT. The gate electrode DT_G of the driving transistor DT may be connected to a first connection electrode BE1 through a first contact hole CNT1. The first connection electrode BE1 may be connected to a first electrode S1-1 of a (1-1)th transistor ST1-1 and a drain electrode D3-2 of a (3-2)th transistor ST3-2 through a second contact hole CNT2. The first connection electrode BE1 may cross a kth scan line Sk. The first electrode DT_S of the driving transistor DT may be connected to a first electrode S2 of the second transistor ST2. The second electrode DT_D of the driving transistor DT may be connected to a first electrode S3-1 of a (3-1)th transistor ST3-1 and a first electrode S5 of the fifth transistor ST5.

The first transistor ST1 may be formed as a dual transistor. The first transistor ST1 may include the (1-1)th transistor ST1-1 and a (1-2)th transistor ST1-2.

The (1-1)th transistor ST1-1 may include an active layer ACT1-1, a gate electrode G1-1, the first electrode S1-1, and a second electrode D1-1. The gate electrode G1-1 of the (1-1)th transistor ST1-1 may be a part of a (k−1)th scan line Sk-1, and may be an overlapping area between the active layer ACT1-1 of the (1-1)th transistor ST1-1 and the (k−1)th scan line Sk-1. The first electrode S1-1 of the (1-1)th transistor ST1-1 may be connected to the first connection electrode BE1 of the driving transistor DT through the second contact hole CNT2. The second electrode D1-1 of the (1-1)th transistor ST1-1 may be connected to a first electrode S1-2 of the (1-2)th transistor ST1-2.

The (1-2)th transistor ST1-2 may include an active layer ACT1-2, a gate electrode G1-2, the first electrode S1-2, and a second electrode D1-2. The gate electrode G1-2 of the (1-2)th transistor ST1-2 may be a part of the (k−1)th scan line Sk-1, and may be an overlapping area between the active layer ACT1-2 of the (1-2)th transistor ST1-2 and the (k−1)th scan line Sk-1. The first electrode S1-2 of the (1-2)th transistor ST1-2 may be connected to the second electrode D1-1 of the (1-1)th transistor ST1-1. The second electrode D1-2 of the (1-2)th transistor ST1-2 may be connected to an initialization connection electrode VIE through a fourth contact hole CNT4.

The second transistor ST2 may include an active layer ACT2, a gate electrode G2, the first electrode S2, and a second electrode D2. The gate electrode G2 of the second transistor ST2 may be a part of the kth scan line Sk, and may be an overlapping area between the active layer ACT2 of the second transistor ST2 and the kth scan line Sk. The first electrode S2 of the second transistor ST2 may be connected to the first electrode DT_S of the driving transistor DT. The second electrode D2 of the second transistor ST2 may be connected to a jth data line Dj through a third contact hole CNT3.

The third transistor ST3 may be formed as a dual transistor. The third transistor ST3 may include the (3-1)th transistor ST3-1 and the (3-2)th transistor ST3-2.

The (3-1)th transistor ST3-1 may include an active layer ACT3-1, a gate electrode G3-1, the first electrode S3-1, and a second electrode D3-1. The gate electrode G3-1 of the (3-1)th transistor ST3-1 may be a part of the kth scan line Sk, and may be an overlapping area between the active layer ACT3-1 of the (3-1)th transistor ST3-1 and the kth scan line Sk. The first electrode S3-1 of the (3-1)th transistor ST3-1 may be connected to the second electrode DT_D of the driving transistor DT. The second electrode D3-1 of the (3-1)th transistor ST3-1 may be connected to a first electrode S3-2 of the (3-2)th transistor ST3-2.

The (3-2)th transistor ST3-2 may include an active layer ACT3-2, a gate electrode G3-2, the first electrode S3-2, and the second electrode D3-2. The gate electrode G3-2 of the (3-2)th transistor ST3-2 may be a part of the kth scan line Sk, and may be an overlapping area between the active layer ACT3-2 of the (3-2)th transistor ST3-2 and the kth scan line Sk. The first electrode S3-2 of the (3-2)th transistor ST3-2 may be connected to the second electrode D3-1 of the (3-1)th transistor ST3-1. The second electrode D3-2 of the (3-2)th transistor ST3-2 may be connected to the first connection electrode BE1 through the second contact hole CNT2.

The fourth transistor ST4 may include an active layer ACT4, a gate electrode G4, a first electrode S4, and a second electrode D4. The gate electrode G4 of the fourth transistor ST4 may be a part of a kth emission line Ek, and may be an overlapping area between the active layer ACT4 of the fourth transistor ST4 and the kth emission line Ek. The first electrode S4 of the fourth transistor ST4 may be connected to a second electrode CE12 of the first capacitor C1 through a seventh contact hole CNT7. The second electrode D4 of the fourth transistor ST4 may be connected to the first electrode DT_S of the driving transistor DT.

The fifth transistor ST5 may include an active layer ACT5, a gate electrode G5, the first electrode S5, and a second electrode D5. The gate electrode G5 of the fifth transistor ST5 may be a part of the kth emission line Ek, and may be an overlapping area between the active layer ACT5 of the fifth transistor ST5 and the kth emission line Ek. The first electrode S5 of the fifth transistor ST5 may be connected to the second electrode DT_D of the driving transistor DT. The second electrode D5 of the fifth transistor ST5 may be connected to an anode AND of a light emitting element through a sixth contact hole CNT6.

Figure 11:
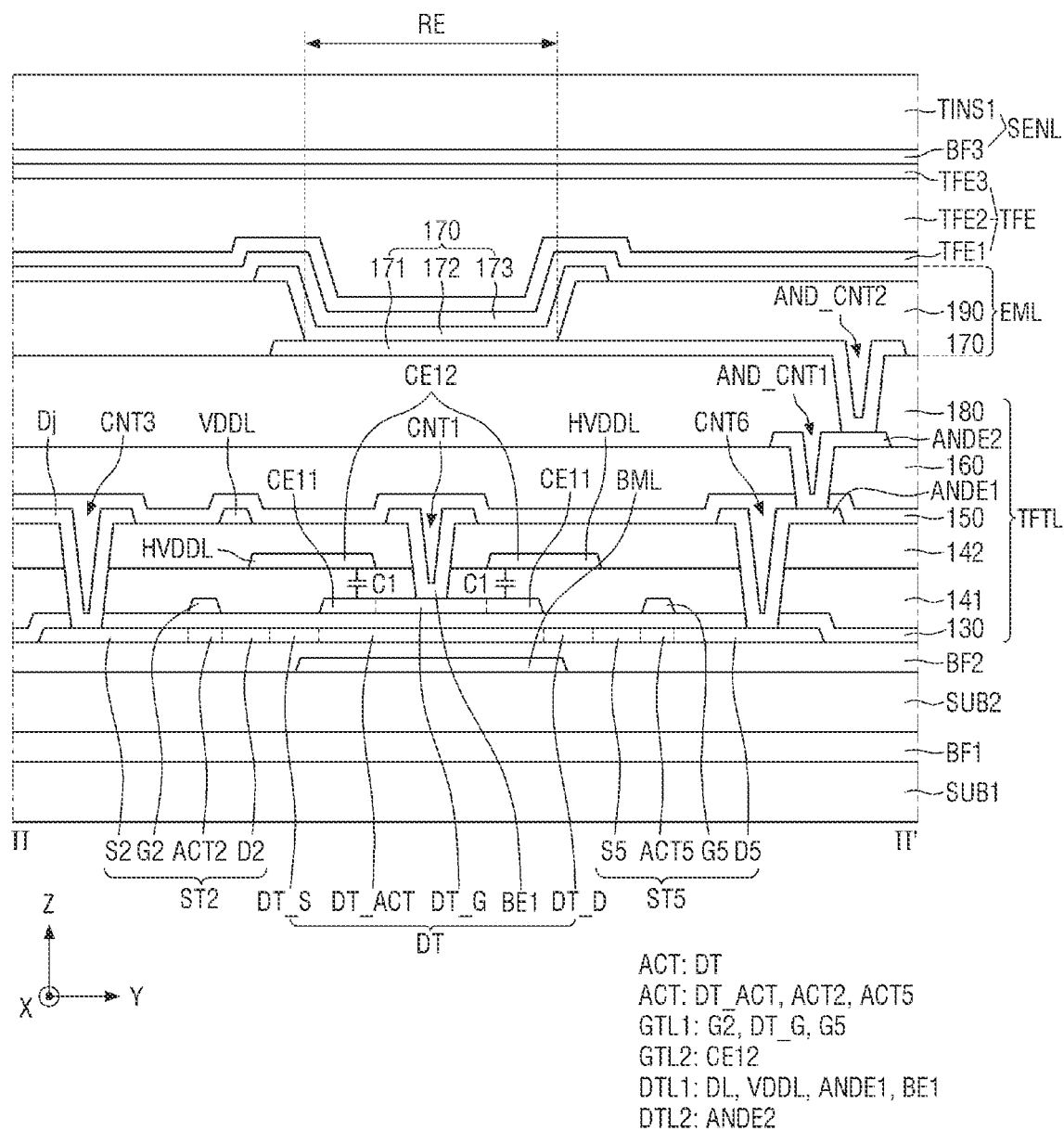
FIG. 11 is a cross-sectional view of an example of the display panel taken along the line II-II' of FIG. 9.

The sixth transistor ST6 may include an active layer ACT6, a gate electrode G6, a first electrode S6, and a second electrode D6. The gate electrode G6 of the sixth transistor ST6 may be a part of the kth scan line Sk, and may be an overlapping area between the active layer ACT6 of the sixth transistor ST6 and the kth scan line Sk. A first anode connection electrode ANDE1 may be connected to the first electrode S6 of the sixth transistor ST6 through the sixth contact hole CNT6. A second anode connection electrode ANDE2 may be connected to the first anode connection electrode ANDE1 through a first anode contact hole AND_CNT1 as illustrated in FIG. 11. The first light emitting electrode 171 of the light emitting element may be connected to the second anode connection electrode ANDE2 through a second anode contact hole AND_CNT2 as illustrated in FIG. 11. The second electrode D6 of the sixth transistor ST6 may be connected to the initialization connection electrode VIE through the fourth contact hole CNT4.

An initialization voltage line VIL may be connected to the initialization connection electrode VIE through a fifth contact hole CNT5, and the initialization connection electrode VIE may be connected to the second electrode D1-2 of the (1-2)th transistor ST1-2 and the second electrode D6 of the sixth transistor ST6 through the fourth contact hole CNT4. The initialization connection electrode VIE may cross the kth scan line Sk.

A first electrode CE11 of the first capacitor C1 may be a part of the gate electrode DT_G of the driving transistor DT. The second electrode CE12 of the first capacitor C1 may be a part of a horizontal driving voltage line HVDDL connected to a first driving voltage line VDDL through an eighth contact hole CNT8. The first electrode CE11 and the second electrode CE12 may overlap with each other.

Figure 10:
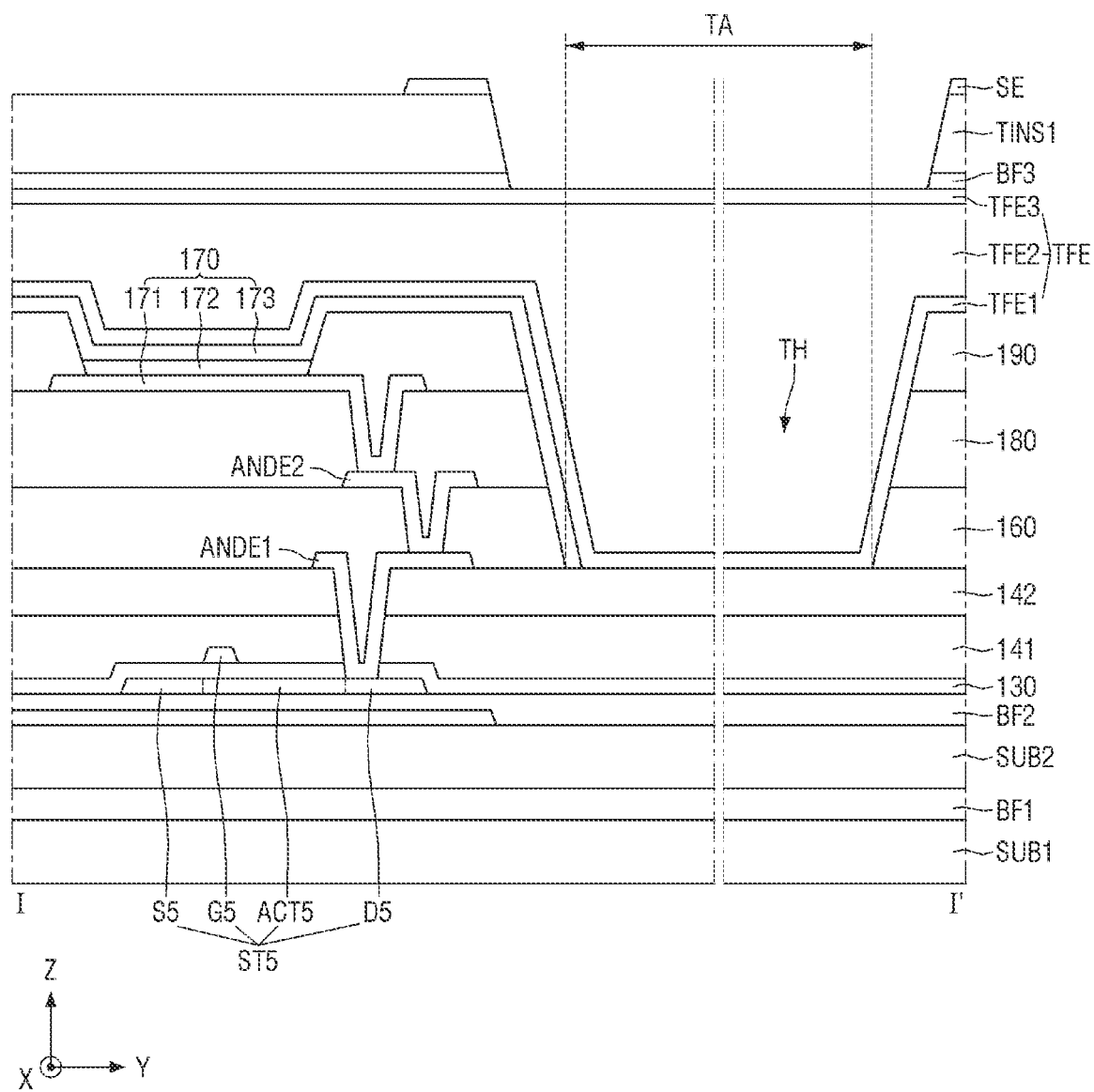
FIG. 10 is a cross-sectional view of an example of the display panel taken along the line I-I' of FIG. 8.

FIG. 10 is a cross-sectional view of an example of the display panel 300 taken along the line I-I' of FIG. 8. FIG. 11 is a cross-sectional view of an example of the display panel 300 taken along the line II-II' of FIG. 9.

In FIG. 10, the active layer ACT5, the gate electrode G5, the source electrode S5, and the drain electrode D5 of the fifth transistor ST5, which is electrically connected to the first light emitting electrode 171, are illustrated for convenience of illustration and description.

Referring to FIGS. 10 and 11, a first buffer layer BF1 may be disposed on a first substrate SUB1. A second substrate SUB2 may be disposed on the first buffer layer BF1, and a second buffer layer BF2 may be disposed on the second substrate SUB2. A thin-film transistor layer TFTL, a light emitting element layer EML, an encapsulation layer TFE, and a touch sensor layer SENL may be sequentially disposed on the second buffer layer BF2.

Each of the first substrate SUB1 and the second substrate SUB2 may include (e.g., may be made of) an insulating material, for example, such as glass, quartz, or polymer resin. For example, each of the first substrate SUB1 and the second substrate SUB2 may include polyimide. Each of the first substrate SUB1 and the second substrate SUB2 may be a flexible substrate that may be bent, folded, and/or rolled.

Each of the first buffer layer BF1 and the second buffer layer BF2 is a layer for protecting thin-film transistors of the thin-film transistor layer TFTL and a light emitting layer 172 of the light emitting element layer EML from moisture introduced through the first substrate SUB1 and the second substrate SUB2, which may be vulnerable to moisture penetration. Each of the first buffer layer BF1 and the second buffer layer BF2 may be composed of a plurality of inorganic layers that are stacked alternately on one another. For example, each of the first buffer layer BF1 and the second buffer layer BF2 may be a multilayer in which one or more inorganic layers selected from a silicon nitride layer, a silicon oxynitride layer, a silicon oxide layer, a titanium oxide layer, and an aluminum oxide layer are alternately stacked.

A light blocking layer BML may be disposed on the second substrate SUB2. The light blocking layer BML may overlap with the active layer DT_ACT of the driving transistor DT to prevent or substantially prevent generation of a leakage current due to light incident on the active layer DT_ACT of the driving transistor DT. Although the light blocking layer BML is shown as overlapping with only the active layer DT_ACT of the driving transistor DT in FIG. 11, the present disclosure is not limited thereto. For example, the light blocking layer BML may overlap with the active layer DT_ACT of the driving transistor DT as well as with the active layers ACT1 through ACT6 of the first through sixth transistors ST1 through ST6. The light blocking layer BML may be covered by the second buffer layer BF2. The light blocking layer BML may be a single layer or a multilayer including (e.g., made of) any one or more of molybdenum (Mo), aluminum (Al), chromium (Cr), gold (Au), titanium (Ti), nickel (Ni), neodymium (Ne), copper (Cu), and alloys thereof.

The thin-film transistor layer TFTL includes an active layer ACT, a first gate layer GTL1, a second gate layer GTL2, a first source metal layer DTL1, a second source metal layer DTL2, a gate insulating layer 130, a first interlayer insulating film 141, a second interlayer insulating film 142, a first planarization layer 160, and a second planarization layer 180.

The active layer ACT may be formed on the second buffer layer BF2. The active layer ACT may include polycrystalline silicon, monocrystalline silicon, low-temperature polycrystalline silicon, amorphous silicon, or an oxide semiconductor. When the active layer ACT includes (e.g., is made of) polycrystalline silicon, the ion-doped active layer ACT may have conductivity. Therefore, the active layer ACT may include the active layers DT_ACT of the driving transistor DT and ACT1 through ACT6 of the first through sixth transistors ST1 through ST6 of the first subpixel SP1, as well as the source electrodes DT_S, S1, S2-1, S2-2, S3-1, S3-2, S4, S5 and S6 and the drain electrodes DT_D, D1, D2-1, D2-2, D3-1, D3-2, D4, D5 and D6.

The gate insulating layer 130 may be formed on the active layer ACT. The gate insulating layer 130 may include (e.g., may be made of) an inorganic layer, for example, such as a silicon nitride layer, a silicon oxynitride layer, a silicon oxide layer, a titanium oxide layer, or an aluminum oxide layer.

The first gate layer GTL1 may be formed on the gate insulating layer 130. The first gate layer GTL1 may include the gate electrodes DT_G of the driving transistor DT and G1 through G6 of the first through sixth transistors ST1 through ST6 of the first subpixel SP1, as well as scan lines SL and emission lines ECL. The first gate layer GTL1 may be a single layer or a multilayer including (e.g., made of) any one or more of molybdenum (Mo), aluminum (Al), chromium (Cr), gold (Au), titanium (Ti), nickel (Ni), neodymium (Ne), copper (Cu), and alloys thereof.

The first interlayer insulating film 141 may be formed on the first gate layer GTL1. The first interlayer insulating film 141 may include (e.g., may be made of) an inorganic layer, for example, such as a silicon nitride layer, a silicon oxynitride layer, a silicon oxide layer, a titanium oxide layer, or an aluminum oxide layer. The first interlayer insulating film 141 may include a plurality of inorganic layers.

The second gate layer GTL2 may be formed on the first interlayer insulating film 141. The second gate layer GTL2 may include the initialization voltage line VIL and the second electrode CE12 of the first capacitor C1. The second gate layer GTL2 may be a single layer or a multilayer including (e.g., made of) any one or more of molybdenum (Mo), aluminum (Al), chromium (Cr), gold (Au), titanium (Ti), nickel (Ni), neodymium (Ne), copper (Cu), and alloys thereof.

The second interlayer insulating film 142 may be formed on the second gate layer GTL2. The second interlayer insulating film 142 may include (e.g., may be made of) an inorganic layer, for example, such as a silicon nitride layer, a silicon oxynitride layer, a silicon oxide layer, a titanium oxide layer, or an aluminum oxide layer. The second interlayer insulating film 142 may include a plurality of inorganic layers.

The first source metal layer DTL1 may be formed on the second interlayer insulating film 142. The first source metal layer DTL1 may include data lines DL, first driving voltage lines VDDL, the first connection electrode BE1, the first anode connection electrode ANDE1, and the initialization connection electrode VIE. The first source metal layer DTL1 may be a single layer or a multilayer including (e.g., made of) any one or more of molybdenum (Mo), aluminum (Al), chromium (Cr), gold (Au), titanium (Ti), nickel (Ni), neodymium (Ne), copper (Cu), and alloys thereof.

The first planarization layer 160 may be formed on the first source metal layer DTL1 to flatten (e.g., to planarize) steps due to the active layer ACT, the first gate layer GTL1, the second gate layer GTL2, and the first source metal layer DTL1. The first planarization layer 160 may include (e.g., may be made of) an organic layer, for example, such as acryl resin, epoxy resin, phenolic resin, polyamide resin, or polyimide resin.

In some embodiments, a protective layer 150 may be additionally formed between the first source metal layer DTL1 and the first planarization layer 160. The protective layer 150 may include (e.g., may be made of) an inorganic layer, for example, such as a silicon nitride layer, a silicon oxynitride layer, a silicon oxide layer, a titanium oxide layer, or an aluminum oxide layer.

The second source metal layer DTL2 may be formed on the first planarization layer 160. The second source metal layer DTL2 may include the second anode connection electrode ANDE2. The second source metal layer DTL2 may be a single layer or a multilayer including (e.g., made of) any one or more of molybdenum (Mo), aluminum (Al), chromium (Cr), gold (Au), titanium (Ti), nickel (Ni), neodymium (Ne), copper (Cu), and alloys thereof.

The second planarization layer 180 may be formed on the second source metal layer DTL2. The second planarization layer 180 may include (e.g., may be made of) an organic layer, for example, such as acryl resin, epoxy resin, phenolic resin, polyamide resin, or polyimide resin.

Although the driving transistor DT and the first through sixth transistors ST1 through ST6 of the first subpixel SP1 are illustrated as a top-gate type in which a gate electrode is located above an active layer, the present disclosure is not limited thereto. In other words, the driving transistor DT and the first through sixth transistors ST1 through ST6 of the first subpixel SP1 may be formed as a bottom-gate type in which the gate electrode is located under the active layer, or a double-gate type in which the gate electrode is located both above and under the active layer.

The first contact hole CNT1 may be a hole penetrating the first interlayer insulating film 141 and the second interlayer insulating film 142 to expose the gate electrode DT_G of the driving transistor DT as illustrated in FIG. 11. The first connection electrode BE1 may be connected to the gate electrode DT_G of the driving transistor DT through the first contact hole CNT1.

The second contact hole CNT2 may be a hole penetrating the gate insulting layer 130, the first interlayer insulating film 141, and the second interlayer insulating film 142 to expose the first electrode S1-1 of the (1-1)th transistor ST1-1 and the second electrode D3-1 of the (3-1)th transistor ST3-1. The second connection electrode BE2 may be connected to the first electrode S1-1 of the (1-1)th transistor ST1-1 and the second electrode D3-1 of the (3-1)th transistor ST3-1 through the second contact hole CNT2.

The third contact hole CNT3 may be a hole penetrating the gate insulating layer 130, the first interlayer insulating film 141, and the second interlayer insulating film 142 to expose the first electrode S2 of the second transistor ST2. The jth data line Dj may be connected to the first electrode S2 of the second transistor ST2 through the third contact hole CNT3.

The fourth contact hole CNT4 may be a hole penetrating the gate insulating layer 130, the first interlayer insulating film 141, and the second interlayer insulating film 142 to expose the second electrode D1 (e.g., D1-2) of the first transistor ST1 (e.g., ST1-2) and the second electrode D4 of the fourth transistor ST4. The initialization connection electrode VIE may be connected to the second electrode D1-2 of the (1-2)th transistor ST1-2 and the second electrode D4 of the fourth transistor ST4 through the fourth contact hole CNT4.

The fifth contact hole CNT5 may be a hole penetrating the second interlayer insulating film 142 to expose the initialization voltage line VIL. The initialization connection electrode VIE may be connected to the initialization voltage line VIL through the fifth contact hole CNT5.

The sixth contact hole CNT6 may be a hole penetrating the gate insulating layer 130, the first interlayer insulating film 141, and the second interlayer insulating film 142 to expose the second electrode D5 of the fifth transistor ST5 as illustrated in FIG. 11. The first anode connection electrode ANDE1 may be connected to the second electrode D5 of the fifth transistor ST5 through the sixth contact hole CNT6.

The seventh contact hole CNT7 may be a hole penetrating the gate insulating layer 130, the first interlayer insulating film 141, and the second interlayer insulating film 142 to expose the first electrode S4 of the fourth transistor ST4. The first driving voltage line VDDL may be connected to the first electrode S4 of the fourth transistor ST4 through the seventh contact hole CNT7.

The eighth contact hole CNT8 may be a hole penetrating the second interlayer insulating film 142 to expose the horizontal driving voltage line HVDDL. The first driving voltage line VDDL1 may be connected to the horizontal driving voltage line HVDDL through the eighth contact hole CNT8.

The first anode contact hole AND_CNT1 may be a hole penetrating the protective layer 150 and the first planarization layer 160 to expose the first anode connection electrode ANDE1 as illustrated in FIG. 11.

The second anode contact hole AND_CNT2 may be a hole penetrating the second planarization layer 180 to expose the second anode connection electrode ANDE2 as illustrated in FIG. 11.

The light emitting element layer EML is formed on the thin-film transistor layer TFTL. The light emitting element layer EML includes light emitting elements 170 and a bank 190.

The light emitting elements 170 and the bank 190 are formed on the second planarization layer 180. Each of the light emitting elements 170 may include the first light emitting electrode 171, the light emitting layer 172, and a second light emitting electrode 173.

The first light emitting electrode 171 may be formed on the second planarization layer 180. The first light emitting electrode 171 may be connected to the second anode connection electrode ANDE2 through the second anode contact hole AND_CNT2 penetrating the second planarization layer 180.

In a top emission structure in which light is emitted in a direction from the light emitting layer 172 toward the second light emitting electrode 173, the first light emitting electrode 171 may include (e.g., may be made of) a metal material having high reflectivity, for example, such as a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The APC alloy may be an alloy of silver (Ag), palladium (Pd), and copper (Cu).

The bank 190 may be formed on the second planarization layer 180 to define the first light emitting electrode 171 so as to define each of the emission areas RE, GE1, BE, and GE2. The bank 190 may be formed to cover edges of the first light emitting electrode 171. The bank 190 may include (e.g., may be made of) an organic layer, for example, such as acryl resin, epoxy resin, phenolic resin, polyamide resin, or polyimide resin.

Each of the emission areas RE, GE1, BE, and GE2 is an area in which the first light emitting electrode 171, the light emitting layer 172, and the second light emitting electrode 173 are sequentially stacked, so that holes from the first light emitting electrode 171 and electrons from the second light emitting electrode 173 combine together in the light emitting layer 172 to emit light.

The light emitting layer 172 is formed on the first light emitting electrode 171 and the bank 190. The light emitting layer 172 may include an organic material to emit light of a desired color (e.g., a predetermined color). For example, the light emitting layer 172 may include a hole transporting layer, an organic material layer, and an electron transporting layer.

The second light emitting electrode 173 is formed on the light emitting layer 172. The second light emitting electrode 173 may be formed to cover the light emitting layer 172. The second light emitting electrode 173 may be a common layer common to the subpixels SP1 through SP4. A capping layer may be formed on the second light emitting electrode 173.

In the top emission structure, the second light emitting electrode 173 may include (e.g., may be made of) a transparent conductive material (TCO) capable of transmitting light, for example, such as indium tin oxide (ITO) or indium zinc oxide (IZO), or a semi-transmissive conductive material, for example, such as magnesium (Mg), silver (Ag), or an alloy of Mg and Ag. When the second light emitting electrode 173 includes (e.g., is made of) a semi-transmissive conductive material, light output efficiency may be increased by a microcavity.

The encapsulation layer TFE may be formed on the light emitting element layer EML. The encapsulation layer TFE may include at least one inorganic layer to prevent or substantially prevent oxygen and/or moisture from penetrating into the light emitting element layer EML. In addition, the encapsulation layer TFE may include at least one organic layer to protect the light emitting element layer EML from foreign substances, for example, such as dust. For example, the encapsulation layer TFE may include a first inorganic layer TFE1, an organic layer TFE2, and a second inorganic layer TFE3.

The first inorganic layer TFE1 may be disposed on the second light emitting electrode 173, the organic layer TFE2 may be disposed on the first inorganic layer TFE1, and the second inorganic layer TFE3 may be disposed on the organic layer TFE2. Each of the first inorganic layer TFE1 and the second inorganic layer TFE3 may be a multilayer in which one or more inorganic layers selected from a silicon nitride layer, a silicon oxynitride layer, a silicon oxide layer, a titanium oxide layer, and an aluminum oxide layer are alternately stacked. The organic layer TFE2 may be a monomer.

The touch sensor layer SENL is disposed on the encapsulation layer TFE.

The touch sensor layer SENL includes a third buffer layer BF3, the touch electrodes SE, and a touch insulating layer TINS1.

The third buffer layer BF3 may be disposed on the encapsulation layer TFE. The third buffer layer BF3 may be a layer having insulating and optical functions. The third buffer layer BF3 may include at least one inorganic layer. For example, the third buffer layer BF3 may be a multilayer in which one or more inorganic layers selected from a silicon nitride layer, a silicon oxynitride layer, a silicon oxide layer, a titanium oxide layer, and an aluminum oxide layer are alternately stacked. The third buffer layer BF3 may be formed by a lamination process using a ductile material, a process such as spin coating or slit die coating using a solution material, or a deposition process. However, the present disclosure is not limited thereto, and the third buffer layer BF3 may be omitted.

The touch insulating layer TINS1 may be disposed on the third buffer layer BF3. The touch insulating layer TINS1 may be a layer having insulating and optical functions. The touch insulating layer TINS1 may include (e.g., may be made of) an inorganic layer, for example, such as a silicon nitride layer, a silicon oxynitride layer, a silicon oxide layer, a titanium oxide layer, or an aluminum oxide layer. In another example, the touch insulating layer TINS1 may include (e.g., may be made of) an organic layer, for example, such as acryl resin, epoxy resin, phenolic resin, polyamide resin, or polyimide resin. The touch insulating layer TINS1 may be formed by a lamination process using a ductile material, a process such as spin coating or slit die coating using a solution material, or a deposition process.

The touch electrodes SE may be disposed on the touch insulating layer TINS1. The touch electrodes SE may not overlap with the emission areas RE, GE1, BE, and GE2 and the transmissive area TA. In other words, the touch electrodes SE may not be formed at (e.g., in or on) the emission areas RE, GE1, BE, and GE2 and the transmissive area TA. Each of the touch electrodes SE may be a single layer including (e.g., made of) molybdenum (Mo), titanium (Ti), copper (Cu), or aluminum (Al), or may have a stacked structure of aluminum and titanium (Ti/Al/Ti), a stacked structure of aluminum and indium tin oxide (ITO/Al/ITO), an APC alloy, or a stacked structure of an APC alloy and indium tin oxide (ITO/APC/ITO).

The transmissive area TA may be an area to transmit light in which a metal layer of the thin-film transistor layer TFTL, a metal layer of a light emitting element layer EML, and a metal layer of the touch sensor layer SENL are not disposed. Therefore, the transmissive area TA may include the first substrate SUB1, the first buffer layer BF1, the second substrate SUB2, the second buffer layer BF2, the gate insulating layer 130, the first interlayer insulating film 141, the second interlayer insulating film 142, the first inorganic layer TFE1, the organic layer TFE2, and the second inorganic layer TFE3.

The transmissive area TA may include a transmissive hole TH. The transmissive hole TH may be a hole penetrating the first planarization layer 160, the second planarization layer 180, and the bank 190 to expose the second interlayer insulating film 142 of the thin-film transistor layer TFTL. The transmissive hole TH may be filled with the encapsulation layer TFE. For example, the transmissive hole TH may be filled with the first inorganic layer TFE1 and the organic layer TFE2. Therefore, the first inorganic layer TFE1 and the second interlayer insulating film 142 may contact each other in the transmissive area TA. In addition, because the transmissive hole TH of the transmissive area TA is filled with the organic layer TFE2, a maximum thickness of the organic layer TFE2 at (e.g., in or on) the transmissive area TA may be greater than a maximum thickness of the organic layer TFE2 at (e.g., in or on) the pixel area PXA.

Polyimide has high absorbance of short-wavelength light (e.g., blue-based light). Thus, when the first planarization layer 160, the second planarization layer 180, and the bank 190 include (e.g., are made of) polyimide, they may absorb the short-wavelength light. Therefore, when the first planarization layer 160, the second planarization layer 180, and the bank 190 are disposed in the transmissive area TA, the intensity of the short-wavelength light in the light sensed by the optical devices 740 through 770 may be low (e.g., may be very low).

Because the transmissive area TA includes the transmissive hole TH penetrating at least one organic layer made of polyimide, for example, the first planarization layer 160, the second planarization layer 180, and the bank 190 as illustrated in FIG. 10, the transmissive hole TH may prevent or substantially prevent short-wavelength light from among the light incident on the optical devices 740 through 770 from being absorbed by at least one organic layer.

Although the second light emitting electrode 173 is disposed on a side surface of the transmissive hole TH in FIG. 10, the present disclosure is not limited thereto. For example, the second light emitting electrode 173 may not be disposed on the side surface of the transmissive hole TH, but may be disposed on the bank 190. In other words, the second light emitting electrode 173 may not be disposed on an upper surface of the second interlayer insulating film 142, side surfaces of the first planarization layer 160, side surfaces of the second planarization layer 180, and side surfaces of the bank 190 in the transmissive hole TH.

Figure 12:
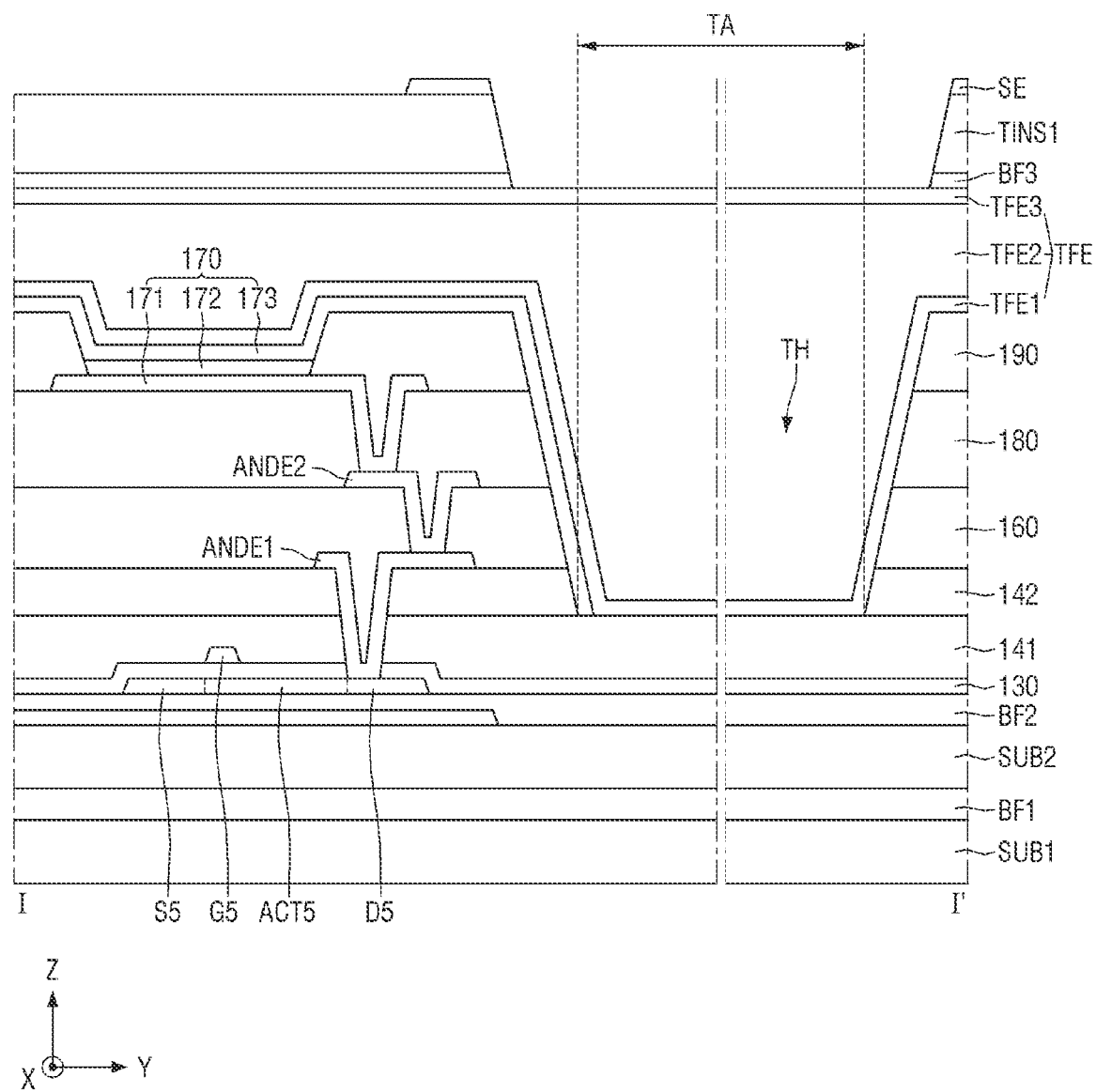
FIG. 12 is a cross-sectional view of an example of the display panel taken along the line I-I' of FIG. 8.

FIG. 12 is a cross-sectional view of an example of the display panel 300 taken along the line I-I' of FIG. 8.

The embodiment of FIG. 12 may be different from the embodiment of FIG. 10 in that a transmissive hole TH of a transmissive area TA in FIG. 12 penetrates a second interlayer insulating film 142, a first planarization layer 160, a second planarization layer 180, and a bank 190 to expose a first interlayer insulating film 141. Thus, redundant description thereof may not be repeated.

Referring to FIG. 12, the transmissive area TA may include a first substrate SUB1, a first buffer layer BF1, a second substrate SUB2, a second buffer layer BF2, a gate insulating layer 130, the first interlayer insulating film 141, a first inorganic layer TFE1, an organic layer TFE2, and a second inorganic layer TFE3. The first inorganic layer TFE1 and the first interlayer insulating film 141 may contact each other at (e.g., in or on) the transmissive area TA.

When the second interlayer insulating film 142 includes a plurality of inorganic layers having different refractive indices from one another, the transmittance of light passing through the second interlayer insulating film 142 may be lowered due to a difference between the refractive indices of the inorganic layers. For example, when the second interlayer insulating film 142 includes a silicon nitride layer and a silicon oxide layer, the transmittance of light passing through the second interlayer insulating film 142 may be lowered due to a difference between refractive indices of the silicon nitride layer and the silicon oxide layer.

As another example, when the second interlayer insulating film 142 is a single inorganic layer different from the first interlayer insulating film 141, the transmittance of light passing through the second interlayer insulating film 142 may be lowered due to a difference between refractive indices of the first interlayer insulating film 141 and the second interlayer insulating film 142. For example, when any one of the first interlayer insulating film 141 and the second interlayer insulating film 142 is a silicon nitride layer and the other thereof is a silicon oxide layer, the transmittance of light passing through the second interlayer insulating film 142 may be lowered due to a difference between refractive indices of the silicon nitride layer and the silicon oxide layer.

Because the transmissive area TA includes the transmissive hole TH penetrating the second interlayer insulating film 142, the first planarization layer 160, the second planarization layer 180, and the bank 190 as illustrated in FIG. 12, the transmittance of light passing through the transmissive area TA may be prevented or substantially prevented from being reduced by the second interlayer insulating film 142.

Although a second light emitting electrode 173 is disposed on a side surface of the transmissive hole TH in FIG. 12, the present disclosure is not limited thereto. For example, the second light emitting electrode 173 may not be disposed on the side surface of the transmissive hole TH, but may be disposed on the bank 190. In other words, the second light emitting electrode 173 may not be disposed on an upper surface of the first interlayer insulating film 141, side surfaces of the second interlayer insulating film 142, side surfaces of the first planarization layer 160, side surfaces of the second planarization layer 180, and side surfaces of the bank 190 in the transmissive hole TH.

Figure 13:
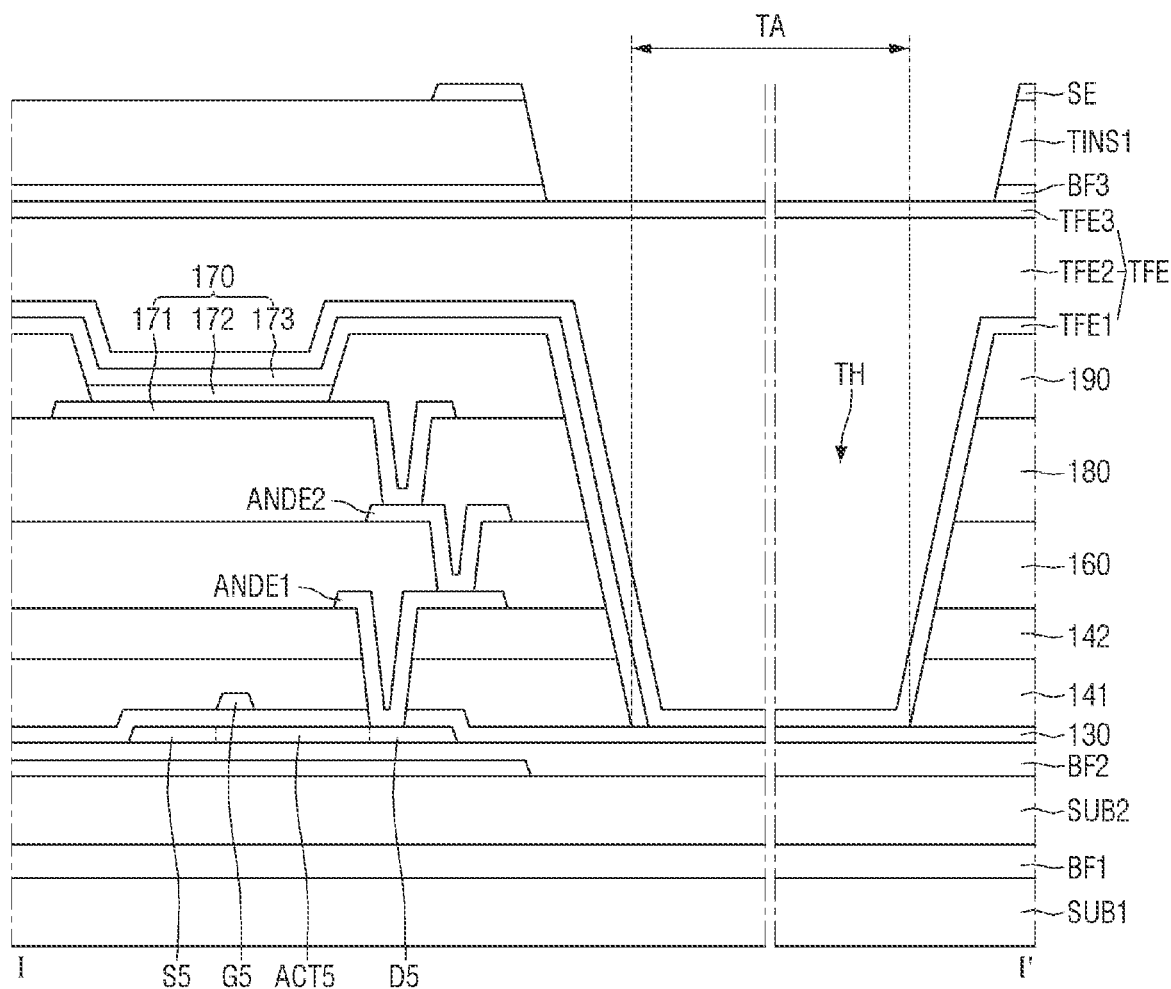
FIG. 13 is a cross-sectional view of an example of the display panel taken along the line I-I' of FIG. 8.

FIG. 13 is a cross-sectional view of an example of the display panel 300 taken along the line I-I' of FIG. 8.

The embodiment of FIG. 13 is different from the embodiment of FIG. 12 in that a transmissive hole TH of a transmissive area TA in FIG. 13 penetrates a first interlayer insulating film 141, a second interlayer insulating film 142, a first planarization layer 160, a second planarization layer 180, and a bank 190 to expose a gate insulating layer 130. Thus, redundant description thereof may not be repeated.

Referring to FIG. 13, the transmissive area TA may include a first substrate SUB1, a first buffer layer BF1, a second substrate SUB2, a second buffer layer BF2, the gate insulating layer 130, a first inorganic layer TFE1, an organic layer TFE2, and a second inorganic layer TFE3. The first inorganic layer TFE1 and the gate insulating layer 130 may contact each other at (e.g., in or on) the transmissive area TA.

When the first interlayer insulating film 141 includes a plurality of inorganic layers having different refractive indices from one another, the transmittance of light passing through the first interlayer insulating film 141 may be lowered due to a difference between the refractive indices of the inorganic layers. For example, when the first interlayer insulating film 141 includes a silicon nitride layer and a silicon oxide layer, the transmittance of light passing through the first interlayer insulating film 141 may be lowered due to a difference between refractive indices of the silicon nitride layer and the silicon oxide layer.

As another example, when the first interlayer insulating film 141 is a single inorganic layer different from the gate insulating layer 130, the transmittance of light passing through the first interlayer insulating film 141 may be lowered due to a difference between refractive indices of the first interlayer insulating film 141 and the gate insulating layer 130. For example, when any one of the first interlayer insulating film 141 and the gate insulating layer 130 is a silicon nitride layer and the other thereof is a silicon oxide layer, the transmittance of light passing through the first interlayer insulating film 141 may be lowered due to a difference between refractive indices of the silicon nitride layer and the silicon oxide layer.

Because the transmissive area TA includes the transmissive hole TH penetrating the first interlayer insulating film 141, the second interlayer insulating film 142, the first planarization layer 160, the second planarization layer 180, and the bank 190 as illustrated in FIG. 13, the transmittance of light passing through the transmissive area TA may be prevented or substantially prevented from being reduced by the first interlayer insulating film 141 as well as the second interlayer insulating film 142.

Although a second light emitting electrode 173 is disposed on a side surface of the transmissive hole TH in FIG. 13, the present disclosure is not limited thereto. For example, the second light emitting electrode 173 may not be disposed on the side surface of the transmissive hole TH but may be disposed on the bank 190. In other words, the second light emitting electrode 173 may not be disposed on an upper surface of the gate insulating layer 130, side surfaces of the first interlayer insulating film 141, side surfaces of the second interlayer insulating film 142, side surfaces of the first planarization layer 160, side surfaces of the second planarization layer 180, and side surfaces of the bank 190 in the transmissive hole TH.

Figure 14:
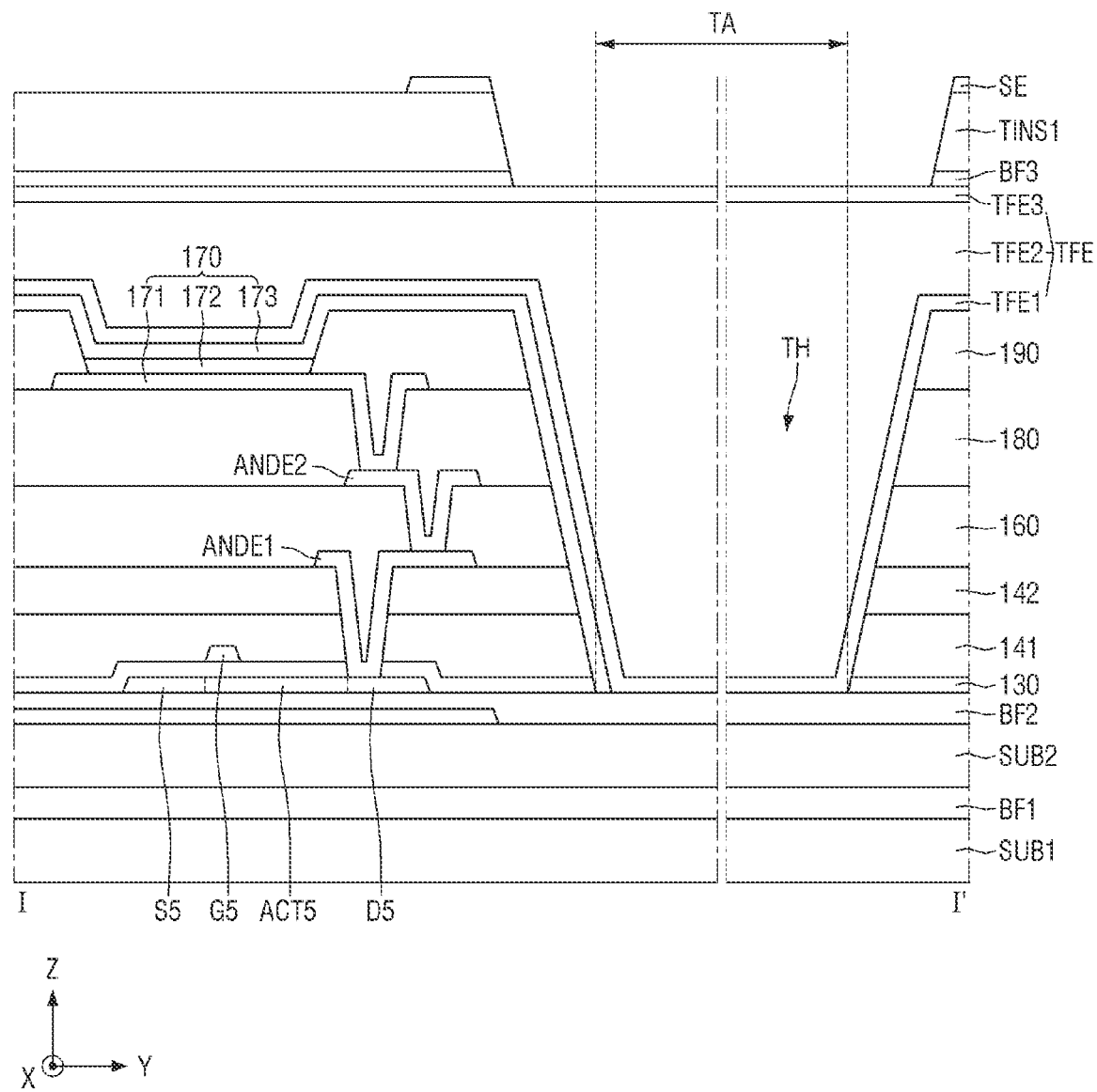
FIG. 14 is a cross-sectional view of an example of the display panel taken along the line I-I' of FIG. 8.

FIG. 14 is a cross-sectional view of an example of the display panel 300 taken along the line I-I' of FIG. 8.

The embodiment of FIG. 14 is different from the embodiment of FIG. 13 in that a transmissive hole TH of a transmissive area TA of FIG. 14 penetrates a gate insulating layer 130, a first interlayer insulating film 141, a second interlayer insulating film 142, a first planarization layer 160, a second planarization layer 180, and a bank 190 to expose a second buffer layer BF2. Thus, redundant description thereof may not be repeated.

Referring to FIG. 14, the transmissive area TA may include a first substrate SUB1, a first buffer layer BF1, a second substrate SUB2, the second buffer layer BF2, a first inorganic layer TFE1, an organic layer TFE2, and a second inorganic layer TFE3. The first inorganic layer TFE1 and the second buffer layer BF2 may contact each other at (e.g., in or on) the transmissive area TA.

When the gate insulating layer 130 is a single inorganic layer different from the second buffer layer BF2, the transmittance of light passing through the gate insulating layer 130 may be lowered due to a difference between refractive indices of the gate insulating layer 130 and the second buffer layer BF2. For example, when any one of the gate insulating layer 130 and the second buffer layer BF2 is a silicon nitride layer and the other thereof is a silicon oxide layer, the transmittance of light passing through the gate insulating layer 130 may be lowered due to a difference between refractive indices of the silicon nitride layer and the silicon oxide layer.

Because the transmissive area TA includes the transmissive hole TH penetrating the gate insulating layer 130, the first interlayer insulating film 141, the second interlayer insulating film 142, the first planarization layer 160, the second planarization layer 180, and the bank 190 as illustrated in FIG. 14, the transmittance of light passing through the transmissive area TA may be prevented or substantially prevented from being reduced by the gate insulating layer 130 as well as the first interlayer insulating film 141 and the second interlayer insulating film 142.

Although a second light emitting electrode 173 is disposed on a side surface of the transmissive hole TH in FIG. 14, the present disclosure is not limited thereto. For example, the second light emitting electrode 173 may not be disposed on the side surface of the transmissive hole TH but may be disposed on the bank 190. In other words, the second light emitting electrode 173 may not be disposed on an upper surface of the second buffer layer BF2, side surfaces of the gate insulating layer 130, side surfaces of the first interlayer insulating film 141, side surfaces of the second interlayer insulating film 142, side surfaces of the first planarization layer 160, side surfaces of the second planarization layer 180, and side surfaces of the bank 190 in the transmissive hole TH.

Figure 15:
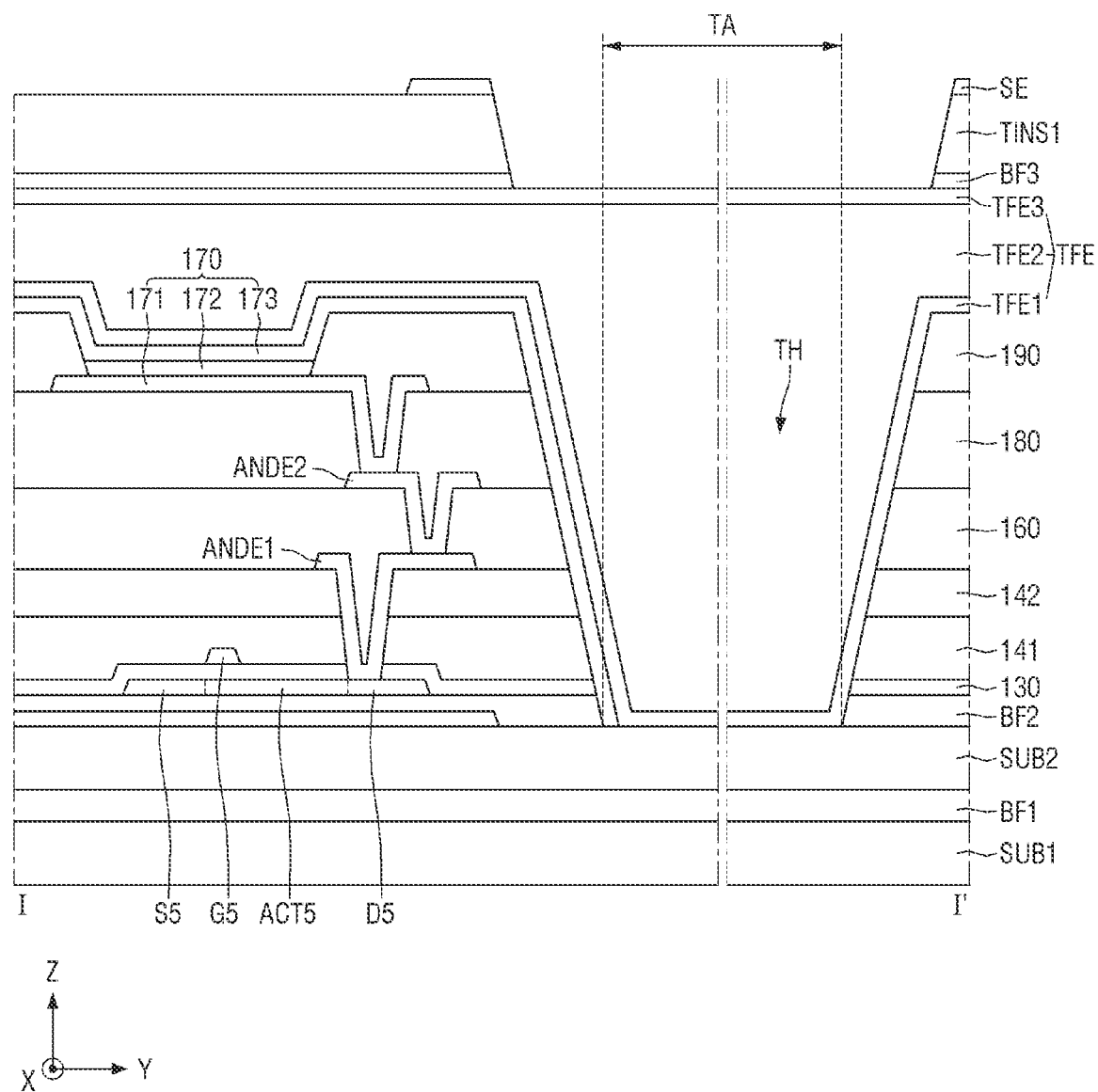
FIG. 15 is a cross-sectional view of an example of the display panel taken along the line I-I' of FIG. 8.

FIG. 15 is a cross-sectional view of an example of the display panel 300 taken along the line I-I' of FIG. 8.

The embodiment of FIG. 15 is different from the embodiment of FIG. 14 in that a transmissive hole TH of a transmissive area TA of FIG. 15 penetrates a second buffer layer BF2, a gate insulating layer 130, a first interlayer insulating film 141, a second interlayer insulating film 142, a first planarization layer 160, a second planarization layer 180, and a bank 190 to expose a second substrate SUB2. Thus, redundant description thereof may not be repeated.

Referring to FIG. 15, the transmissive area TA may include a first substrate SUB1, a first buffer layer BF1, the second substrate SUB2, a first inorganic layer TFE1, an organic layer TFE2, and a second inorganic layer TFE3. The first inorganic layer TFE1 and the second substrate SUB2 may contact each other at (e.g., in or on) the transmissive area TA.

When the second buffer layer BF2 includes a plurality of inorganic layers having different refractive indices from one another, the transmittance of light passing through the second buffer layer BF2 may be lowered due to a difference between the refractive indices of the inorganic layers. For example, when the second buffer layer BF2 includes a silicon nitride layer and a silicon oxide layer, the transmittance of light passing through the second buffer layer BF2 may be lowered due to a difference between refractive indices of the silicon nitride layer and the silicon oxide layer.

As another example, when the second buffer layer BF2 is a single inorganic layer, the transmittance of light passing through the second buffer layer BF2 may be lowered due to a difference between refractive indices of the second buffer layer BF2 and the second substrate SUB2. For example, when the second buffer layer BF2 is an inorganic layer and the second substrate SUB2 is an organic layer, the transmittance of light passing through the second buffer layer BF2 may be lowered due to a difference between refractive indices of the inorganic layer and the organic layer.

Because the transmissive area TA includes the transmissive hole TH penetrating the second buffer layer BF2, the gate insulating layer 130, the first interlayer insulating film 141, the second interlayer insulating film 142, the first planarization layer 160, the second planarization layer 180, and the bank 190 as illustrated in FIG. 15, the transmittance of light passing through the transmissive area TA may be prevented or substantially prevented from being reduced by the second buffer layer BF2 as well as the gate insulating layer 130, the first interlayer insulating film 141, and the second interlayer insulating film 142.

Although a second light emitting electrode 173 is disposed on a side surface of the transmissive hole TH in FIG. 15, the present disclosure is not limited thereto. For example, the second light emitting electrode 173 may not be disposed on the side surface of the transmissive hole TH but may be disposed on the bank 190. In other words, the second light emitting electrode 173 may not be disposed on an upper surface of the second substrate SUB2, side surfaces of the second buffer layer BF2, side surfaces of the gate insulating layer 130, side surfaces of the first interlayer insulating film 141, side surfaces of the second interlayer insulating film 142, side surfaces of the first planarization layer 160, side surfaces of the second planarization layer 180, and side surfaces of the bank 190 in the transmissive hole TH.

Figure 16:
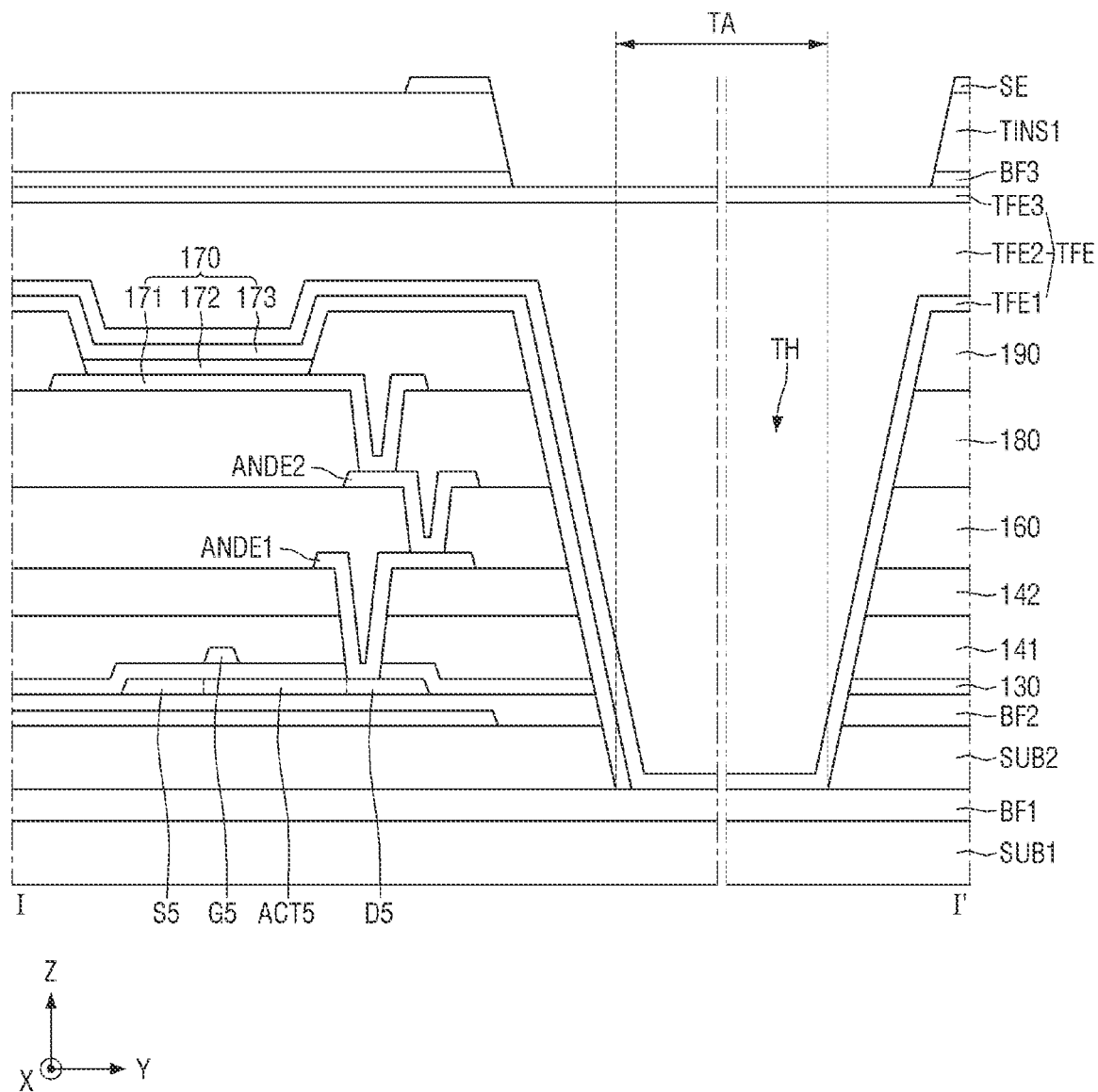
FIG. 16 is a cross-sectional view of an example of the display panel taken along the line I-I' of FIG. 8.

FIG. 16 is a cross-sectional view of an example of the display panel 300 taken along the line I-I' of FIG. 8.

The embodiment of FIG. 16 is different from the embodiment of FIG. 15 in that a transmissive hole TH of a transmissive area TA in FIG. 16 penetrates a second substrate SUB2, a second buffer layer BF2, a gate insulating layer 130, a first interlayer insulating film 141, a second interlayer insulating film 142, a first planarization layer 160, a second planarization layer 180, and a bank 190 to expose a first buffer layer BF1. Thus, redundant description thereof may not be repeated.

Referring to FIG. 16, the transmissive area TA may include a first substrate SUB1, the first buffer layer BF1, a first inorganic layer TFE1, an organic layer TFE2, and a second inorganic layer TFE3. The first inorganic layer TFE1 and the first buffer layer BF1 may contact each other at (e.g., in or on) the transmissive area TA.

The transmittance of light passing through the second substrate SUB2 may be lowered due to a difference between refractive indices of the second substrate SUB2 and the first buffer layer BF1. For example, when the first buffer layer BF1 is an inorganic layer and the second substrate SUB2 is an organic layer, the transmittance of light passing through the second substrate SUB2 may be lowered due to a difference between refractive indices of the inorganic layer and the organic layer.

In addition, because polyimide has high absorbance of short-wavelength light (e.g., blue-based light), when the second substrate SUB2 is made of polyimide, the second substrate SUB2 may absorb the short-wavelength light. Therefore, when the second substrate SUB2 is disposed in the transmissive area TA, the intensity of the short-wavelength light in the light sensed by the optical devices 740 through 770 may be low (e.g., may be very low).

Because the transmissive area TA includes the transmissive hole TH penetrating the second substrate SUB2, the second buffer layer BF2, the gate insulating layer 130, the first interlayer insulating film 141, the second interlayer insulating film 142, the first planarization layer 160, the second planarization layer 180, and the bank 190 as illustrated in FIG. 16, the transmittance of light passing through the transmissive area TA may be prevented or substantially prevented from being reduced by the second substrate SUB2 as well as the second buffer layer BF2, the gate insulating layer 130, the first interlayer insulating film 141, and the second interlayer insulating film 142. In addition, the transmissive hole TH may prevent or substantially prevent short-wavelength light from among the light incident on the optical devices 740 through 770 from being absorbed by the second substrate SUB2.

Although a second light emitting electrode 173 is disposed on a side surface of the transmissive hole TH in FIG. 16, the present disclosure is not limited thereto. For example, the second light emitting electrode 173 may not be disposed on the side surface of the transmissive hole TH but may be disposed on the bank 190. In other words, the second light emitting electrode 173 may not be disposed on an upper surface of the first buffer layer BF1, side surfaces of the second substrate SUB2, side surfaces of the second buffer layer BF2, side surfaces of the gate insulating layer 130, side surfaces of the first interlayer insulating film 141, side surfaces of the second interlayer insulating film 142, side surfaces of the first planarization layer 160, side surfaces of the second planarization layer 180, and side surfaces of the bank 190 in the transmissive hole TH.

Figure 17:
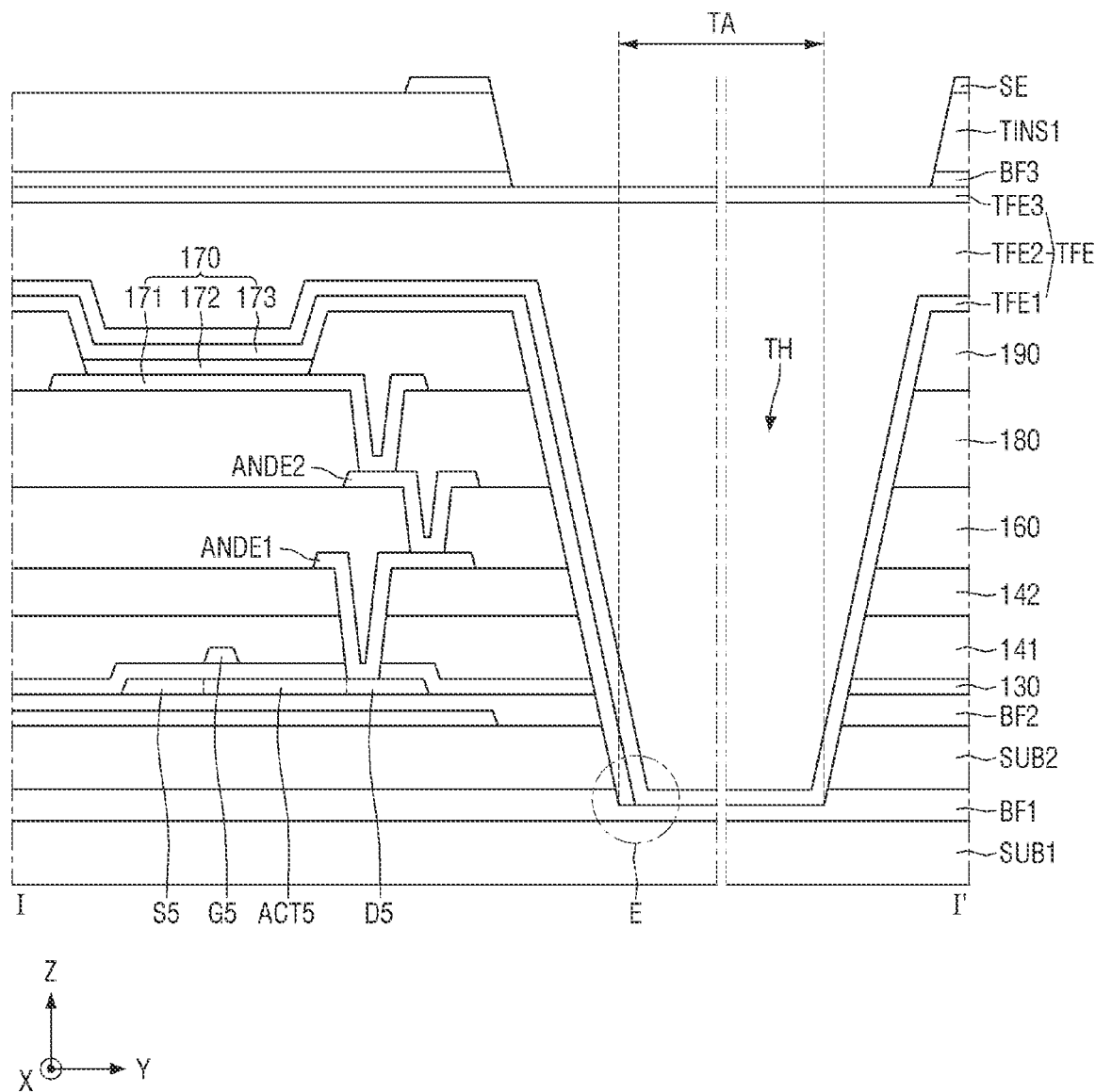
FIG. 17 is a cross-sectional view of an example of the display panel taken along the line I-I' of FIG. 8.
Figure 18:
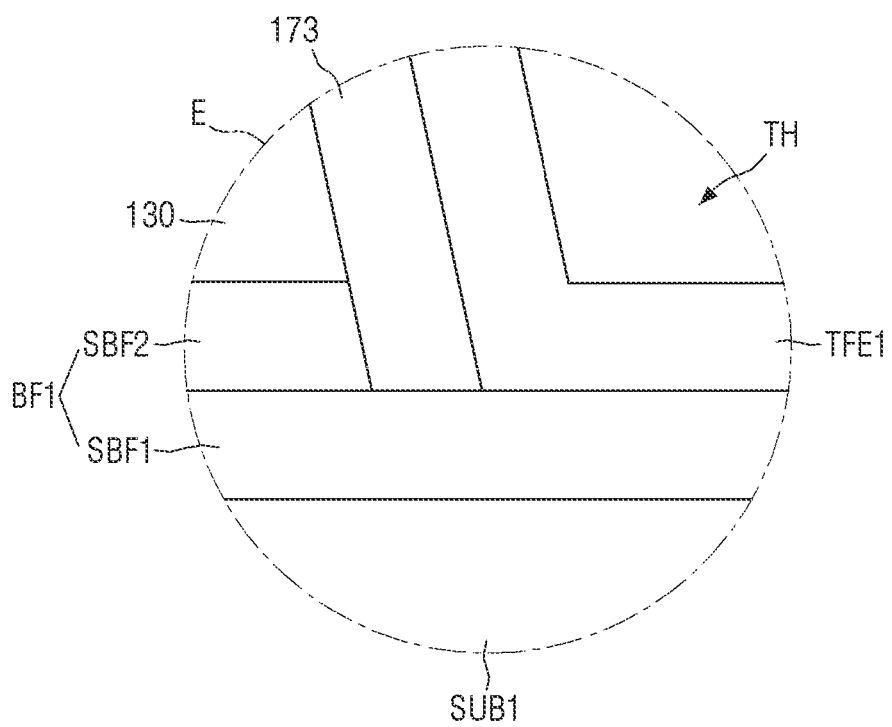
FIG. 18 is an enlarged detailed cross-sectional view of the area E of FIG. 17.

FIG. 17 is a cross-sectional view of an example of the display panel 300 taken along the line I-I' of FIG. 8. FIG. 18 is an enlarged detailed cross-sectional view of the area E of FIG. 17.

The embodiment of FIGS. 17 and 18 is different from the embodiment of FIG. 16 in that a transmissive hole TH of a transmissive area TA in FIGS. 17 and 18 penetrates a second sub-buffer layer SBF2 of a first buffer layer BF1, a second substrate SUB2, a second buffer layer BF2, a gate insulating layer 130, a first interlayer insulating film 141, a second interlayer insulating film 142, a first planarization layer 160, a second planarization layer 180, and a bank 190 to expose a first sub-buffer layer SBF1. Thus, redundant description thereof may not be repeated.

Referring to FIGS. 17 and 18, the transmissive area TA may include a first substrate SUB1, the first sub-buffer layer SBF1 of the first buffer layer BF1, a first inorganic layer TFE1, an organic layer TFE2, and a second inorganic layer TFE3. The first inorganic layer TFE1 and the first sub-buffer layer SBF1 of the first buffer layer BF1 may contact each other at (e.g., in or on) the transmissive area TA.

When the first buffer layer BF1 includes the first sub-buffer layer SBF1 and the second sub-buffer layer SBF2 having different refractive indices from each other as illustrated in FIG. 18, the transmittance of light passing through the first buffer layer BF1 may be lowered due to a difference between the refractive indices of the first sub-buffer layer SBF1 and the second sub-buffer layer SBF2. For example, when the first buffer layer BF1 includes a silicon nitride layer and a silicon oxide layer, the transmittance of light passing through the first buffer layer BF1 may be lowered due to a difference between refractive indices of the silicon nitride layer and the silicon oxide layer.

Because the transmissive area TA includes the transmissive hole TH penetrating the second sub-buffer layer SBF2 of the first buffer layer BF1, the second substrate SUB2, the second buffer layer BF2, the gate insulating layer 130, the first interlayer insulating film 141, the second interlayer insulating film 142, the first planarization layer 160, the second planarization layer 180, and the bank 190 as illustrated in FIG. 17, the transmittance of light passing through the transmissive area TA may be prevented or substantially prevented from being reduced by the first buffer layer BF1 as well as the second substrate SUB2, the second buffer layer BF2, the gate insulating layer 130, the first interlayer insulating film 141, and the second interlayer insulating film 142.

Although a second light emitting electrode 173 is disposed on a side surface of the transmissive hole TH in FIG. 17, the present disclosure is not limited thereto. For example, the second light emitting electrode 173 may not be disposed on the side surface of the transmissive hole TH but may be disposed on the bank 190. In other words, the second light emitting electrode 173 may not be disposed on an upper surface of the first sub-buffer layer SBF1, side surfaces of the second sub-buffer layer SBF2, side surfaces of the second substrate SUB2, side surfaces of the second buffer layer BF2, side surfaces of the gate insulating layer 130, side surfaces of the first interlayer insulating film 141, side surfaces of the second interlayer insulating film 142, side surfaces of the first planarization layer 160, side surfaces of the second planarization layer 180, and side surfaces of the bank 190 in the transmissive hole TH.

Figure 19:
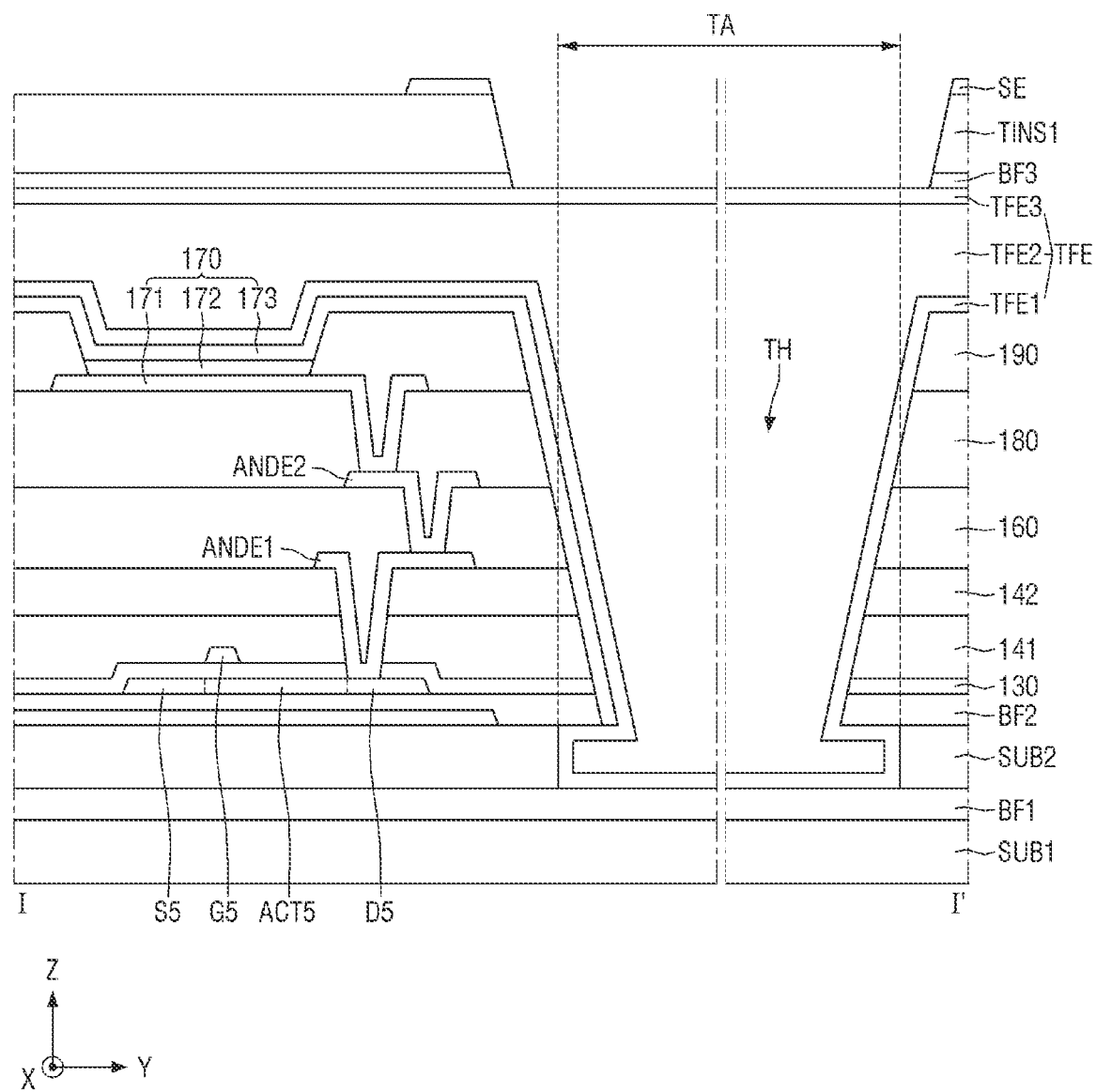
FIG. 19 is a cross-sectional view of an example of the display panel taken along the line I-I' of FIG. 8.

FIG. 19 is a cross-sectional view of an example of the display panel 300 taken along the line I-I' of FIG. 8.

The embodiment of FIG. 19 is different from the embodiment of FIG. 16 in that a second buffer layer BF2 in FIG. 19 protrudes further in a direction (e.g., the y-axis direction) than a second substrate SUB2 at (e.g., in or on) a transmissive area TA. Thus, redundant description thereof may not be repeated.

Referring to FIG. 19, when the second substrate SUB2 is over-etched using the second buffer layer BF2 as a mask, the second buffer layer BF2 may protrude further in a direction, for example, the second direction (e.g., the Y-axis direction), than the second substrate SUB2 at (e.g., in or on) the transmissive area TA. Here, because the second buffer layer BF2 is an inorganic layer and the second substrate SUB2 is an organic layer, for example, such as polyimide, an etching material used to etch the second substrate SUB2 may be a material that does not react with the inorganic layer and reacts with the organic layer. In this case, similar to the eaves of a roof, the second buffer layer BF2 may protrude further than the second substrate SUB2 in the second direction (e.g., the Y-axis direction), and a lower surface of the second buffer layer BF2 may be exposed. Therefore, a distance between parts of the second substrate SUB2 in the second direction (e.g., the Y-axis direction) in the transmissive hole TH may be greater than a distance between parts of the second buffer layer BF2.

In addition, in the transmissive area TA, the second buffer layer BF2 may protrude further than the second substrate SUB2 in the first direction (e.g., the X-axis direction). In this case, similar to the eaves of a roof, the second buffer layer BF2 may protrude further than the second substrate SUB2 in the first direction (e.g., the X-axis direction), and a lower surface of the second buffer layer BF2 may be exposed. Therefore, a distance between parts of the second substrate SUB2 in the first direction (e.g., the X-axis direction) in the transmissive hole TH may be greater than a distance between parts of the second buffer layer BF2.

When a first inorganic layer TFE1 is formed by atomic layer deposition (ALD) or chemical vapor deposition (CVD), the first inorganic layer TFE1 may have suitable step coverage (e.g., may have excellent step coverage) characteristics. Step coverage indicates that a layer formed by a suitable process (e.g., a predetermined process) is continuous without being broken even at a part where a step is formed. Therefore, the first inorganic layer TFE1 may also be formed on the lower surface of the second buffer layer BF2 exposed by removal of the second substrate SUB2 from the transmissive hole TH. In other words, the first inorganic layer TFE1 may be disposed on the lower surface of the second buffer layer BF2, side surfaces of the second substrate SUB2, and an upper surface of a first buffer layer BF1 in the transmissive hole TH.

As illustrated in FIG. 19, because the second buffer layer BF2, similar to the eaves of a roof, protrudes further in a direction than the second substrate SUB2 and has its lower surface exposed, the first inorganic layer TFE1 may be disposed on the lower surface of the second buffer layer BF2, the side surfaces of the second substrate SUB2, and the upper surface of the first buffer layer BF1 in the transmissive hole TH. Therefore, the second buffer layer BF2 and the first inorganic layer TFE1 may directly contact each other, thereby improving an encapsulating capability.

Although a second light emitting electrode 173 is disposed on a side surface of the transmissive hole TH in FIG. 19, the present disclosure is not limited thereto. For example, the second light emitting electrode 173 may not be disposed on the side surface of the transmissive hole TH but may be disposed on a bank 190. In other words, the second light emitting electrode 173 may not be disposed on the upper surface of the first buffer layer BF1, the side surfaces of the second substrate SUB2, lower and side surfaces of the second buffer layer BF2, side surfaces of a gate insulating layer 130, side surfaces of a first interlayer insulating film 141, side surfaces of a second interlayer insulating film 142, side surfaces of a first planarization layer 160, side surfaces of a second planarization layer 180, and side surfaces of the bank 190 in the transmissive hole TH.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display device comprising:
   a first substrate;
   a first buffer layer on the first substrate;
   an active layer of a transistor on the first buffer layer;
   a first insulating layer on the active layer of the transistor;
   a gate electrode of the transistor on the first insulating layer;
   a second insulating layer on the gate electrode of the transistor;
   a first planarization layer on the second insulating layer;
   a first light emitting electrode on the first planarization layer;
   a bank covering a part of the first light emitting electrode;
   a light emitting layer on an exposed part of the first light emitting electrode that is not covered by the bank;
   a second light emitting electrode on the light emitting layer and the bank; and
   a first inorganic layer on the second light emitting electrode,
   wherein the first buffer layer comprises a first sub-buffer layer on the first substrate and a second sub-buffer layer on and in contact with the first sub-buffer layer,
   wherein the first sub-buffer layer is in contact with the first substrate in a transmissive area, and
   wherein the second light emitting electrode is in direct contact with the first sub-buffer layer in the transmissive area.

2. The display device of claim 1, wherein the first sub-buffer layer and the second sub-buffer layer have different refractive indices from each other.

3. The display device of claim 1, wherein the transmissive area comprises a transmissive hole penetrating the bank, the first planarization layer, the second insulating layer, the first insulating layer, and the second sub-buffer layer.

4. The display device of claim 3, wherein the second light emitting electrode is in contact with a side surface of the second sub-buffer layer in the transmissive hole.

5. The display device of claim 1, further comprising:
   a second substrate on the first buffer layer; and
   a second buffer layer on the second substrate,
   wherein the active layer of the transistor is on the second buffer layer.

6. The display device of claim 1, further comprising:
   a third insulating layer on the second insulating layer; and
   a first connection electrode on the third insulating layer and connected to an electrode of the transistor extending from the active layer of the transistor through a first contact hole penetrating the third insulating layer, the second insulating layer, and the first insulating layer,
   wherein the first planarization layer is on the first connection electrode.

7. The display device of claim 6, wherein the transmissive area comprises a transmissive hole penetrating the bank, the first planarization layer, the third insulating layer, the second insulating layer, the first insulating layer, and the second sub-buffer layer.

8. The display device of claim 7, wherein the second light emitting electrode is in contact with a side surface of the first planarization layer, a side surface of the third insulating layer, a side surface of the second insulating layer, a side surface of the first insulating layer, and a side surface of the second sub-buffer layer in the transmissive hole.

9. The display device of claim 8, further comprising:
   a second connection electrode located on the first planarization layer and connected to the first connection electrode through a second contact hole penetrating the first planarization layer; and
   a second planarization layer on the second connection electrode,
   wherein the first light emitting electrode is on the second planarization layer, and
   wherein the first light emitting electrode is connected to the second connection electrode through a third contact hole penetrating the second planarization layer.

10. The display device of claim 9, wherein the transmissive area comprises a transmissive hole penetrating the bank, the second planarization layer, the first planarization layer, the third insulating layer, the second insulating layer, the first insulating layer, and the second sub-buffer layer.

11. The display device of claim 10, wherein the second light emitting electrode is in contact with a side surface of the second planarization layer, a side surface of the first planarization layer, a side surface of the third insulating layer, a side surface of the second insulating layer, a side surface of the first insulating layer, and a side surface of the second sub-buffer layer in the transmissive hole.

12. The display device of claim 1, further comprising:
   an organic layer on the first inorganic layer; and
   a second inorganic layer on the organic layer,
   wherein the organic layer fills a transmissive hole in the transmissive area.

13. The display device of claim 12, further comprising:
   a touch insulating layer on the second inorganic layer; and
   a touch electrode on the touch insulating layer, wherein the touch insulating layer and the touch electrode are not at the transmissive area.

14. The display device of claim 13, further comprising:
a third buffer layer on the second inorganic layer,
wherein the touch insulating layer is on the third buffer layer, and
wherein the third buffer layer is not at the transmissive area.

15. The display device of claim 12, wherein a maximum thickness of the organic layer at a pixel area adjacent to the transmissive area is less than a maximum thickness of the organic layer at the transmissive area.

16. The display device of claim 1, further comprising:
an optical device located below the first substrate and overlapping the transmissive area.

17. A display device comprising:
a first substrate;
a first buffer layer on the first substrate;
an active layer of a transistor on the first buffer layer;
a first insulating layer on the active layer of the transistor;
a gate electrode of the transistor on the first insulating layer;
a second insulating layer on the gate electrode of the transistor;
a first planarization layer on the second insulating layer;
a first light emitting electrode on the first planarization layer;
a bank covering a part of the first light emitting electrode;
a light emitting layer on an exposed part of the first light emitting electrode that is not covered by the bank;
a second light emitting electrode on the light emitting layer and the bank; and
a first inorganic layer on the second light emitting electrode,
wherein the first buffer layer comprises a first sub-buffer layer on the first substrate and a second sub-buffer layer on and in contact with the first sub-buffer layer,
wherein the first sub-buffer layer is in contact with the first substrate in a transmissive area, and
wherein the second light emitting electrode is in contact with a side surface of the first planarization layer, a side surface of the second insulating layer, and a side surface of the first insulating layer.

18. A display device comprising:
a first substrate;
a first buffer layer on the first substrate;
an active layer of a transistor on the first buffer layer;
a first insulating layer on the active layer of the transistor;
a gate electrode of the transistor on the first insulating layer;
a second insulating layer on the gate electrode of the transistor;
a first planarization layer on the second insulating layer;
a first light emitting electrode on the first planarization layer;
a bank covering a part of the first light emitting electrode;
a light emitting layer on an exposed part of the first light emitting electrode that is not covered by the bank;
a second light emitting electrode on the light emitting layer and the bank;
a first inorganic layer on the second light emitting electrode;
a second substrate on the first buffer layer; and
a second buffer layer on the second substrate,
wherein the active layer of the transistor is on the second buffer layer,
wherein the first buffer layer comprises a first sub-buffer layer on the first substrate and a second sub-buffer layer on the first sub-buffer layer,
wherein the first sub-buffer layer is in contact with the first substrate in a transmissive area, and
wherein the transmissive area comprises a transmissive hole penetrating the bank, the first planarization layer, the second insulating layer, the first insulating layer, the second buffer layer, the second substrate, and the second sub-buffer layer.

19. The display device of claim 18, wherein the second light emitting electrode is in contact with a side surface of the first planarization layer, a side surface of the second insulating layer, a side surface of the first insulating layer, a side surface of the second buffer layer, a side surface of the second substrate, and a side surface of the second sub-buffer layer in the transmissive hole.

* * * * *